US012580364B2

(12) United States Patent
Baba et al.

(10) Patent No.: US 12,580,364 B2
(45) Date of Patent: Mar. 17, 2026

(54) SEMICONDUCTOR LASER DEVICE

(71) Applicant: Nuvoton Technology Corporation Japan, Kyoto (JP)

(72) Inventors: Yasuo Baba, Toyama (JP); Tohru Nishikawa, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 1008 days.

(21) Appl. No.: 17/720,911

(22) Filed: Apr. 14, 2022

(65) Prior Publication Data

US 2022/0239058 A1     Jul. 28, 2022

Related U.S. Application Data

(63) Continuation of application No. PCT/JP2020/039828, filed on Oct. 23, 2020.

(30) Foreign Application Priority Data

Oct. 24, 2019     (JP) ................................. 2019-193503

(51) Int. Cl.
| | |
|---|---|
| *H01S 5/0238* | (2021.01) |
| *H01S 5/02345* | (2021.01) |
| *H01S 5/042* | (2006.01) |
| *H01S 5/22* | (2006.01) |

(52) U.S. Cl.
CPC ........ *H01S 5/0238* (2021.01); *H01S 5/02345* (2021.01); *H01S 5/04256* (2019.08); *H01S 5/22* (2013.01)

(58) Field of Classification Search
CPC ............... H01S 5/0238; H01S 5/02345; H01S 5/04256; H01S 5/22; H01S 5/0237
See application file for complete search history.

(56) References Cited

U.S. PATENT DOCUMENTS

| | | | |
|---|---|---|---|
| 2002/0121671 A1 | 9/2002 | Wakisaka et al. | |
| 2008/0151960 A1* | 6/2008 | Furushima ........... | G11B 7/1275 |
| | | | 372/50.12 |
| 2017/0237227 A1* | 8/2017 | Fujimoto ............ | H01S 5/02469 |
| | | | 372/36 |

FOREIGN PATENT DOCUMENTS

| | | |
|---|---|---|
| JP | 2003-198051 A | 2/2002 |
| JP | 6508152 B2 | 5/2019 |

OTHER PUBLICATIONS

International Search Report issued on Jan. 12, 2021 in International Patent Application No. PCT/JP2020/039828, with English translation.

* cited by examiner

*Primary Examiner* — Yuanda Zhang
(74) *Attorney, Agent, or Firm* — Rimon P.C.

(57) ABSTRACT

A semiconductor laser device includes a substrate including a main surface, a semiconductor laser element including a resonator extending along a first direction, and a plurality of first wire groups and a plurality of second wire groups arranged along the first direction. Each first wire group includes a first wire bonded to a first bonding region of a top surface of the semiconductor laser element and a first mark portion, and a first mark portion formed on the main surface. Each second wire group includes a second wire bonded to a second bonding region of the main surface, and a second mark portion formed on the main surface. In a top view of the main surface, the first wire is disposed at a position overlapping the first mark portion, and the second wire is disposed at a position overlapping the second mark portion.

27 Claims, 27 Drawing Sheets

FIG. 18

SEMICONDUCTOR LASER DEVICE

CROSS REFERENCE TO RELATED APPLICATIONS

This is a continuation application of PCT International Application No. PCT/JP2020/039828 filed on Oct. 23, 2020, designating the United States of America, which is based on and claims priority of Japanese Patent Application No. 2019-193503 filed on Oct. 24, 2019. The entire disclosures of the above-identified applications, including the specifications, drawings, and claims are incorporated herein by reference in their entirety.

FIELD

The present disclosure relates to a semiconductor laser device.

BACKGROUND

Conventionally, semiconductor laser elements with increasingly higher output power continue to be developed and are attracting attention as highly efficient laser light sources for laser processing. As the output power of the semiconductor laser elements increases, so does the current supplied to the semiconductor laser element. In order to reduce heat generation that accompanies the increase in supplied current, the wire used to supply the current must have low resistance, One conceivable method of lowering the resistance of the wire is to increase the thickness of the wire, but since the size of the electrode of the semiconductor laser element is restricted, there is a limit to the thickness of wire that can be used.

In view of this, a technique for supplying current using a plurality of wires has been proposed (see Patent Literature (PTL) 1). In the invention disclosed by PTL 1, the submount and the electrodes of the semiconductor laser element are connected using a plurality of wires spaced at equal intervals. This reduces the electrical resistance from the submount to the electrodes of the semiconductor laser element more so than when a single wire is used.

CITATION LIST

Patent Literature

PTL 1: Japanese Unexamined Patent Application Publication No. 2003-198051

SUMMARY

Technical Problems

Unfortunately, with the semiconductor laser element disclosed in PTL 1, there are cases in which the plurality of wires are not arranged in appropriate positions. For example, when the plurality of wires are unevenly arranged on an electrode of the semiconductor laser element, the current is not uniformly supplied to the active layer of the semiconductor laser element. Although the current may be, for example, diffused in the electrode to evenly supply current to the active layer of the semiconductor laser element even when the plurality of wires are unevenly arranged, the electrode is not thick enough to sufficiently diffuse the current.

When current is not evenly supplied to the active layer, problems may arise such as a reduction in the output power of the laser beam. Moreover, even when the plurality of wires are unevenly disposed to one part of the submount, this may cause current to be unevenly supplied to the semiconductor laser element. In such cases, heat transmitted by the wires concentrates in that part of the submount, reducing the heat dissipation efficiency of the submount.

The present disclosure was conceived in view of the above problems, and has an object to, in a semiconductor laser device in which current is supplied to a semiconductor laser element using a plurality of wires, arrange the plurality of wires in appropriate positions.

Solution to Problems

In order to overcome the problems described above, a semiconductor laser device according to one aspect of the present disclosure includes: a substrate including a main surface on which a metal film is formed; a semiconductor laser element that is disposed on the main surface and includes a resonator extending along a first direction among in-plane directions of the main surface; and a plurality of first wire groups arranged along the first direction. Each of the plurality of first wire groups includes a first wire and a first mark portion. The first wire is bonded to a first bonding region of a top surface of the semiconductor laser element, and the first mark portion is formed on the main surface. The main surface has a rectangular shape including a first side extending along the first direction, a second side disposed on an opposite side of the first side across the semiconductor laser element and extending along the first direction, and a third side perpendicular to the first side and the second side. In a top view of the main surface, the first wire intersects the first side, and the first wire is disposed at a position overlapping the first mark portion.

This allows the first wires to be placed at appropriate positions by placing the first mark portions at appropriate placement positions for the respective first wires in the top view of the main surface. By inspecting whether the first wires overlap the respective first mark portions in the top view of the main surface, it is possible to determine whether the position of each first wire is acceptable or not acceptable. Evenly distributing the first wires along the first direction makes it possible to supply current evenly to the semiconductor laser element.

In order to overcome the problems described above, a semiconductor laser device according to another aspect of the present disclosure includes: a substrate including a main surface on which a metal film is formed; a semiconductor laser element that is disposed on the main surface and includes a resonator extending along a first direction among in-plane directions of the main surface; and a plurality of second wire groups arranged along the first direction. Each of the plurality of second wire groups includes a second wire and a second mark portion. The second wire is bonded to a second bonding region of the main surface, and the second mark portion is formed on the main surface. The main surface has a rectangular shape including a first side extending along the first direction, a second side disposed on an opposite side of the first side across the semiconductor laser element and extending along the first direction, and a third side perpendicular to the first side and the second side. The second bonding region is disposed between the semiconductor laser element and the second side. In a top view of the main surface, the second wire intersects the second side, and at least one of the second bonding region or the second wire is disposed at a position overlapping the second mark portion.

This allows the second wires to be placed at appropriate positions by placing the second mark portions at appropriate placement positions for the respective second wires in the top view of the main surface. By inspecting whether the second wires overlap the respective second mark portions in the top view of the main surface, it is possible to determine whether the position of each second wire is acceptable or not acceptable. Evenly distributing the second wires along the first direction makes it possible to supply current evenly to the semiconductor laser element.

In one aspect, the semiconductor laser device according to the present disclosure may further include a plurality of second wire groups arranged along the first direction. Each of the plurality of second wire groups may include a second wire and a second mark portion. The second wire may be bonded to a second bonding region of the main surface, and the second mark portion may be formed on the main surface. The second bonding region may be disposed between the semiconductor laser element and the second side. In the top view of the main surface, the second wire may intersect the second side, and at least one of the second bonding region or the second wire may be disposed at a position overlapping the second mark portion.

This allows the second wires to be placed at appropriate positions by placing the second mark portions at appropriate placement positions for the respective second wires in the top view of the main surface. By inspecting whether the second wires overlap the respective second mark portions in the top view of the main surface, it is possible to determine whether the position of each second wire is acceptable or not acceptable. Evenly distributing the first and second wires along the first direction makes it possible to supply current evenly to the semiconductor laser element.

In one aspect of the semiconductor laser device according to the present disclosure, in the top view of the main surface, the first mark portion may include a first mark disposed directly below the first wire.

This makes it easy to determine whether the positions of the first wires are acceptable or not acceptable by simply inspecting whether or not the first wires and the first marks overlap. Moreover, recognizing the first marks during wire bonding makes it easier to place the first wires in the appropriate positions.

In one aspect of the semiconductor laser device according to the present disclosure, in the top view of the main surface, the first mark portion may include two first marks disposed spaced apart from each other and a line segment connecting the two first marks, and the first wire may overlap the line segment connecting the two first marks.

This makes it possible to form a first mark portion including two first marks that is larger than each of the two first marks. Accordingly, for example, when the first mark is formed by removing the metal film from the main surface, the region in which the metal film is removed can be reduced and the first mark portion can be enlarged. This makes it possible to both inhibit uneven current resulting from removing the metal film and enlarge the first mark portion.

In one aspect of the semiconductor laser device according to the present disclosure, the first mark portion may include a first mark formed in the metal film.

Forming the first mark portion in the metal film in this manner eliminates the need to add other components to form the first mark. For example, the first mark is formed by removing a portion of the metal film.

In one aspect of the semiconductor laser device according to the present disclosure, the first mark may be in contact with, among outer edges of the metal film, an outer edge closest to the first side.

Removing the metal film makes it possible to inhibit uneven current resulting from removing the metal film.

In one aspect of the semiconductor laser device according to the present disclosure, in the top view of the main surface, the second mark portion may include a second mark disposed directly below the second wire.

In one aspect of the semiconductor laser device according to the present disclosure, in the top view of the main surface, the second mark portion may include two second marks disposed spaced apart from each other and a line segment connecting the two second marks, and the second wire may overlap the line segment connecting the two second marks.

This makes it possible to form a second mark portion including two second marks that is larger than each of the two second marks. Accordingly, for example, when the second mark is formed by removing the metal film from the main surface, the region in which the metal film is removed can be reduced and the second mark portion can be enlarged. This makes it possible to both inhibit uneven current resulting from removing the metal film and enlarge the second mark portion.

In one aspect of the semiconductor laser device according to the present disclosure, in the top view of the main surface, the second mark portion may include two second marks disposed spaced apart from each other, and the second bonding region may overlap a line segment connecting the two second marks.

This makes it possible to form a second mark portion including two second marks that is larger than each of the two second marks. Accordingly, for example, when the second mark is formed by removing the metal film from the main surface, the region in which the metal film is removed can be reduced and the second mark portion can be enlarged. This makes it possible to both inhibit uneven current resulting from removing the metal film and enlarge the second mark portion.

In one aspect of the semiconductor laser device according to the present disclosure, the second mark portion may include a second mark formed in the metal film.

Forming the second mark portion in the metal film in this manner eliminates the need to add other components to form the second mark. For example, the second mark is formed by removing a portion of the metal film.

In one aspect of the semiconductor laser device according to the present disclosure, the second mark may be in contact with, among outer edges of the metal film, an outer edge closest to the second side.

Disposing the second mark at an outer edge of the metal film in this manner prevents the second mark from interfering with the second bonding region. Moreover, since the second mark is disposed at an outer edge of the metal film, the second mark can be separated from the second bonding region to a relatively large extent, and the effect that forming the second mark has on the current flowing in the metal film can be reduced.

In one aspect, the semiconductor laser device according to the present disclosure may further include a third mark formed on the main surface. In the top view of the main surface, the third mark may overlap a straight line passing through and parallel to a front end face of the semiconductor laser element.

This enables the alignment of the front end face of the semiconductor laser element based on the third mark.

In one aspect, the semiconductor laser device according to the present disclosure may further include a third mark formed on the main surface. In the top view of the main surface, the third mark may overlap a straight line passing through and parallel to a front end face of the semiconductor laser element. The third mark may be disposed closer to the third side than the first mark portion and the second mark portion are.

In one aspect, the semiconductor laser device according to the present disclosure may further include a fourth mark formed on the main surface. In the top view of the main surface, the fourth mark may overlap a straight line passing through and parallel to a rear end face of the semiconductor laser element.

This enables the alignment of the rear end face of the semiconductor laser element based on the fourth mark.

In one aspect, the semiconductor laser device according to the present disclosure may further include a third mark formed on the main surface and a fourth mark formed on the main surface. In the top view of the main surface, the third mark may overlap a straight line passing through and parallel to a front end face of the semiconductor laser element. In the top view of the main surface, the fourth mark may overlap a straight line passing through and parallel to a rear end face of the semiconductor laser element. The second bonding region may be disposed on a straight line connecting the third mark and the fourth mark.

By arranging the third mark and the fourth mark on a straight line passing through the appropriate placement position of the second bonding region, it is possible to arrange the second bonding region in the appropriate position, By inspecting whether or not the second bonding region is arranged on a straight line connecting the third mark and the fourth mark in the top view of main surface, it is possible to determine whether the position of the second bonding region is acceptable or not acceptable.

In one aspect of the semiconductor laser device according to the present disclosure, the semiconductor laser element may include an electrode disposed on the top surface. The electrode may include a plurality of bonding portions and one or more intermediate portions. Each of the one or more intermediate portions may be disposed between two adjacent bonding portions among the plurality of bonding portions. A width in a second direction perpendicular to the first direction of each of the plurality of bonding portions may be greater than a width in the second direction of each of the one or more intermediate portions.

Making the width in the second direction at each bonding portion greater than the width in the second direction at each intermediate portion facilitates bonding of the wires to the respective bonding portions. In addition, by making the widths of the bonding portions and the intermediate portions in the second direction different, each bonding portion can be easily identified, which makes it easy to determine whether or not a wire is bonded to each bonding portion. Moreover, using the difference in widths between the bonding portions and the intermediate portions in pattern recognition makes it possible to prevent wires from protruding from the bonding portions.

In one aspect of the semiconductor laser device according to the present disclosure, among the plurality of bonding portions, the distance from a bonding portion closest to a front end face of the semiconductor laser element to the front end face may be shorter than the distance from a bonding portion closest to a rear end face of semiconductor laser element to the rear end face.

With this, a bonding portion can be positioned close to the front end face, which is likely to consume the largest amount of current in the semiconductor laser element, which means that current can be efficiently supplied to the region close to the front end face.

In one aspect of the semiconductor laser device according to the present disclosure, the semiconductor laser element may include a chip identification mark disposed in, among regions of the electrode, a region closer to the rear end face than to the front end face.

This makes it possible to identify the semiconductor laser element. Moreover, the vicinity of the rear end face of the semiconductor laser element consumes no more current than the vicinity of the front end face. Therefore, placing the chip identification mark in the vicinity of the rear end face reduces the effect on the output of the semiconductor laser element more so than when the chip identification mark is placed in the vicinity of the front end face.

In one aspect of the semiconductor laser device according to the present disclosure, the first bonding regions corresponding to the plurality of first wire groups may be arranged in a staggered arrangement along the first direction.

By arranging the first bonding regions in this manner, more first bonding regions can be provided on the electrode of the semiconductor laser element while inhibiting each first bonding region (i.e., each first wire) from interfering with each other. Accordingly, more heat can be dissipated from the semiconductor laser element through the first bonding regions and the first wires, thereby increasing the heat dissipation efficiency of the semiconductor laser device.

In one aspect of the semiconductor laser device according to the present disclosure, the second bonding regions corresponding to the plurality of second wire groups may be arranged in a staggered arrangement along the first direction.

By arranging the second bonding regions in this manner, more second bonding regions can be provided on the main surface of the substrate while inhibiting each second bonding region (i.e., each second wire) from interfering with each other. Accordingly, more heat can be dissipated from the substrate through the second bonding regions and the second wires, thereby increasing the heat dissipation efficiency of the semiconductor laser device.

In one aspect of the semiconductor laser device according to the present disclosure, each of the plurality of second wire groups may include one or more second marks, and the one or more second marks of the plurality of second wire groups may be arranged in a staggered arrangement along the first direction.

In one aspect of the semiconductor laser device according to the present disclosure, the total number of the plurality of second wire groups may be greater than the total number of the plurality of first wire groups.

This allows the current supplied to each second wire to be reduced.

In one aspect, the semiconductor laser device according to the present disclosure may further include a bonding member that bonds the main surface and the semiconductor laser element.

In one aspect, the semiconductor laser device according to the present disclosure may further include a bonding member that bonds the main surface and the semiconductor laser element. The distance from the second bonding region to the bonding member may be shorter than the distance from the second bonding region to the second side.

This allows each second bonding region to be brought closer to the semiconductor laser element, which is a heat source, so heat can be efficiently dissipated via each second wire. Bringing each second bonding region closer to the semiconductor laser element also reduces the resistance component between each second bonding region and the semiconductor laser element. Accordingly, the power conversion efficiency of the semiconductor laser device can be increased.

In one aspect of the semiconductor laser device according to the present disclosure, the distance from the bonding member to the first side may be shorter than the distance from the bonding member to the second side.

With this, the distance from the semiconductor laser element to the first side can be made shorter than the distance from the semiconductor laser element to the second side. As a result, the surface area of the region of the main surface from semiconductor laser element to the second side is larger than when the distances from the semiconductor laser element to the first side and the second side are equal. Accordingly, it is possible to dispose more second wires (i.e., second bonding regions) in the region of the main surface from the semiconductor laser element to the second side.

In one aspect of the semiconductor laser device according to the present disclosure, the distance from the semiconductor laser element to the first side may be shorter than the distance from the semiconductor laser element to the second side.

As a result, the surface area of the region of the main surface from semiconductor laser element to the second side is larger than when the distances from the semiconductor laser element to the first side and the second side are equal. Accordingly, it is possible to dispose more second wires (i.e., second bonding regions) in the region of the main surface from the semiconductor laser element to the second side.

Advantageous Effects

According to the present disclosure, in a semiconductor laser device in which current is supplied to a semiconductor laser element using a plurality of wires, it is possible to arrange the plurality of wires in appropriate positions.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 18 is a schematic cross sectional view illustrating a configuration of the semiconductor laser element according to Embodiment 2 after being bonded to the substrate.

DESCRIPTION OF EMBODIMENTS

Hereinafter, embodiments will be described with reference to the drawings, Each of the following embodiments shows a specific example of the present disclosure. The numerical values, shapes, materials, elements, the arrangement and connection of the elements, etc., indicated in the following embodiments are mere examples, and therefore do not intend to limit the present disclosure.

The figures are schematic illustrations and are not necessarily precise depictions. Accordingly, the figures are not necessarily to scale. In the figures, elements that are essentially the same share like reference signs. Accordingly, duplicate description is omitted or simplified.

Moreover, in the present specification, the terms "above" and "below" do not refer to the upward (vertically upward) direction and downward (vertically downward) direction in terms of absolute spatial recognition, but are used as terms defined by relative positional relationships based on the stacking order of a stacked configuration. Furthermore, the terms "above" and "below" are applied not only when two elements are disposed with a gap therebetween or when a separate element is interposed between two elements, but also when two elements are disposed in contact with each other.

Embodiment 1

Figure 1:
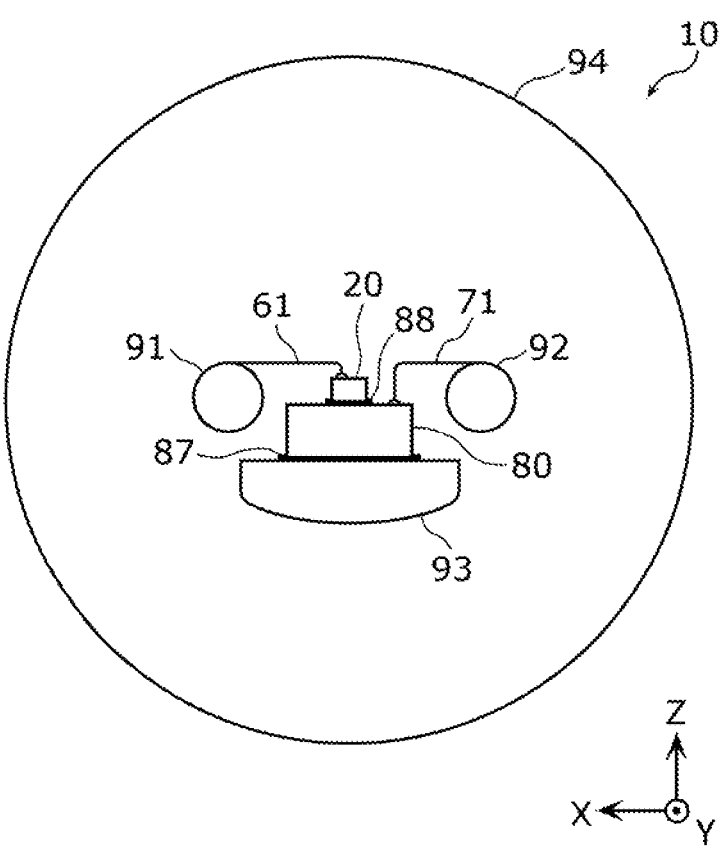
FIG. 1 is a schematic front view illustrating the overall configuration of a semiconductor laser device according to Embodiment 1.
Figure 2:
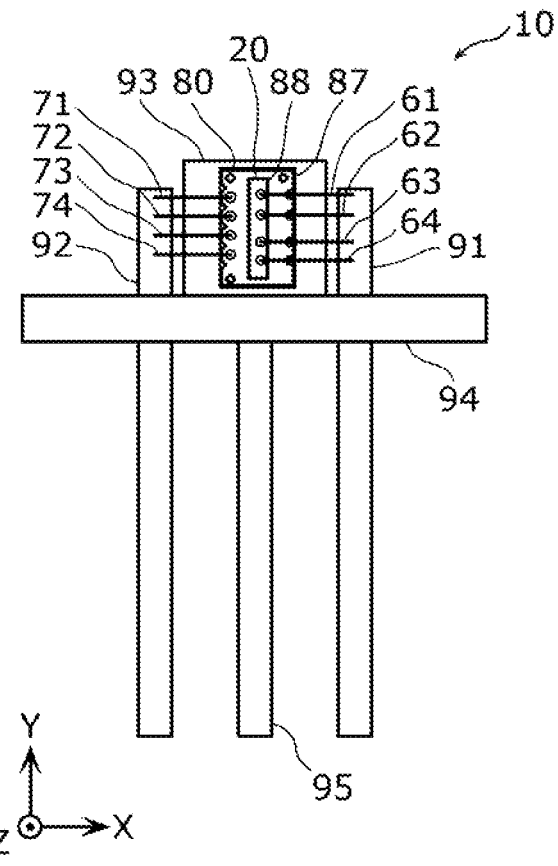
FIG. 2 is a schematic top view illustrating the overall configuration of the semiconductor laser device according to Embodiment 1.
Figure 3:
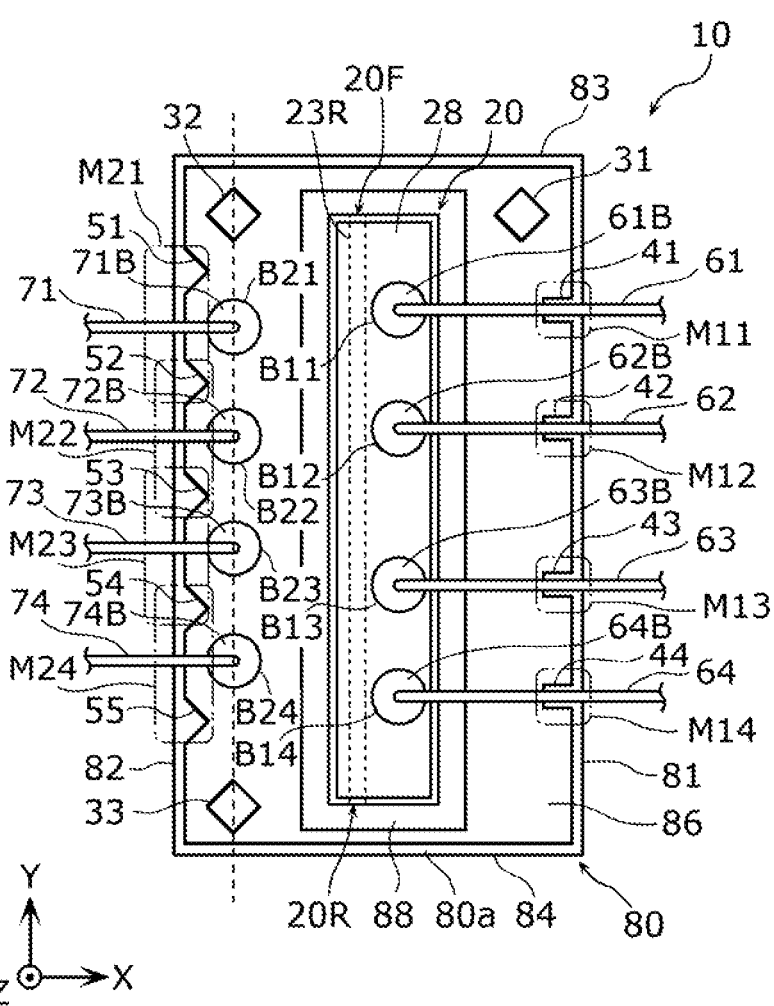
FIG. 3 is a schematic top view illustrating a configuration of a semiconductor laser element and a substrate according to Embodiment 1.

A semiconductor laser device according to Embodiment 1 will be described.
1-1. Overall Configuration
First, the overall configuration of the semiconductor laser device according to the present embodiment will be described with reference to FIG. 1 through FIG. 3. FIG. 1 and FIG. 2 are schematic front and top views, respectively, illustrating the overall configuration of semiconductor laser device 10 according to the present embodiment. FIG. 3 is a schematic top view illustrating a configuration of semiconductor laser element 20 and substrate 80 according to the present embodiment. In FIG. 1 through FIG. 3, the direction of emission of the laser beam by semiconductor laser device is defined as the Y-axis direction, the direction that is perpendicular the Y-axis direction and perpendicular to the surface on which semiconductor laser element 20 of substrate 80 is provided is defined as the Z-axis direction, and the direction perpendicular to the Y-axis direction and the Z-axis direction is defined as the X-axis direction. In each figure, the positive directions of the X-, Y-, and Z-axes are depicted in a right-handed coordinate system. The same applies to the figures presented below.

Semiconductor laser device 10 is a device that emits a laser beam and, as illustrated in FIG. 1 and FIG. 2, includes substrate 80 and semiconductor laser element 20. As illustrated in FIG. 2, semiconductor laser device 10 further includes first wires 61 through 64, second wires 71 through 74, lead pins 91, 92, and 95, stem 93, and base 94. Although not illustrated in FIG. 1 through FIG. 3, semiconductor laser device 10 may include a cap that covers of semiconductor laser element 20, substrate 80, and stem 93.

Base 94 is the base of semiconductor laser device 10. In the present embodiment, base 94 is an electrically conductive member having a disc-like shape.

Lead pins 91, 92 and 95 are terminals for supplying current to semiconductor laser element 20. In the present embodiment, a high potential is applied to lead pin 91 and a low potential is applied to lead pins 92 and 95. Lead pins 91, 92 and 95 are electrical conductors having a cylindrical shape. Lead pins 91 and 92 penetrate base 94. Lead pin 95 is erected on the surface of base 94 opposite the surface on which stem 93 is disposed.

Lead pin 91 is electrically insulated from base 94, More specifically, lead pin 91 is fixed to base 94 via an insulating member (not illustrated in the drawings). Lead pins 92 and 95 are fixed to base 94 in an electrically conductive state with base 94.

Stem 93 is a plate-like member erected on base 94. In the present embodiment, stem 93 also functions as a heat sink for semiconductor laser element 20.

The electrically conductive material included in base 94, lead pins 91, 92 and 95, and stem 93 is not particularly limited. For example, the electrically conductive material is aluminum alloy or Cu or the like.

Semiconductor laser element 20 is a semiconductor element that generates a laser beam. As illustrated in FIG. 3, semiconductor laser element 20 is disposed on main surface 80*a* of substrate 80 and includes a resonator extending along a first direction among in-plane directions of main surface 80*a*. In the present embodiment, the resonator of semiconductor laser element 20 is formed with front end face 20F and rear end face 20R. Front end face 20F is the end face on the end of semiconductor laser element 20 from which the laser beam is emitted, and has a lower reflectance to the laser beam than rear end face 20R. Rear end face 20R is a highly reflective end face that reflects the laser beam of semiconductor laser element 20. The first direction is the direction in which the laser beam resonates, i.e., the direction in which the laser beam is emitted, and is parallel to the Y-axis direction in each figure.

Electrode 28 is formed on the top surface of semiconductor laser element 20 (i.e., the surface opposite the surface bonded to substrate 80). The top surface of semiconductor laser element 20 includes first bonding regions B11 through B14 to which first wires 61 through 64 are respectively bonded. Semiconductor laser element 20 according to the present embodiment is junction-up mounted on main surface 80*a* of substrate 80. In other words, the substrate-side surface of semiconductor laser element 20 is mounted to main surface 80*a*, and the optical waveguide is disposed directly below the top surface of semiconductor laser element 20. Since the first wires are respectively bonded to the first bonding regions in this configuration, there is a risk that ridge portion 23R forming the optical waveguide of semiconductor laser element 20 may be damaged by impact when bonding the first wires. In order to inhibit such damage, each first bonding region is disposed in a region that is not directly above ridge portion 23R. If each of the first bonding regions is arranged in a region that is not directly above ridge portion 23R, it may not be possible to secure enough space width-wise (that is, secure enough space in the X-axis direction dimension in the figures) for each first bonding region. Accordingly, in the present embodiment, ridge portion 23R is offset in a second direction (X-axis direction in the figures) that is perpendicular to the first direction and parallel to the top surface. In the example illustrated in FIG. 3, ridge portion 23R is offset from the center of semiconductor laser element 20 toward second side 82 of main surface 80a of substrate 80. This allows for the width of each first bonding region to be increased. When semiconductor laser element 20 is junction-up mounted on main surface 80a as described above, the width of each first bonding region is more restricted than when semiconductor laser element 20 is junction-down mounted, and thus the diameter of each first wire is also restricted. Therefore, reducing the combined resistance in the first wires by increasing the number of first wires to increase the amount of current supplied to semiconductor laser element 20 that is mounted junction-up is even more necessary than when semiconductor laser element 20 is mounted junction-down.

In the present embodiment, first bonding regions B11 through B14 are arranged in parallel in the first direction. The distances from front end face 20F of semiconductor laser element 20 to the respective centers of first bonding regions B11 through B14 are 0.14 mm, 0.29 mm, 0.49 mm, and 0.64 mm, respectively.

Semiconductor laser element 20 is bonded to metal film 86 on main surface 80a of substrate 80 by bonding member 88. The configuration of bonding member 88 is not particularly limited. In the present embodiment, bonding member 88 includes, in order from the metal film 86 side, a 0.32 μm thick Pt film and a 2.5 μm thick solder film comprising AuSn. The length of bonding member 88 in the second direction is approximately 0.25 mm.

The size and structure of semiconductor laser element 20 are not particularly limited. In the present embodiment, the length of the resonator of semiconductor laser element 20 is 800 μm, the width in second direction is 150 μm, and the thickness (the Z-axis direction dimension) is 85 μm.

The stacked structure of semiconductor laser element 20 will be described later.

Substrate 80 is a submount on which semiconductor laser element 20 is provided. Substrate 80 also functions as a heat sink for semiconductor laser element 20. Although the material included in substrate 80 is not particularly limited so long as the material has a high thermal conductivity, in the present embodiment, the material is SiC.

As illustrated in FIG. 3, substrate 80 includes main surface 80a on which metal film 86 is formed. Although the size and shape of substrate 80 are not particularly limited, in the present embodiment, substrate 80 has a rectangular shape with a length (i.e., a Y-axis direction dimension) of 0.93 mm, a width (i.e., an X-axis direction dimension) of 0.55 mm, and a thickness (i.e., a Z-axis direction dimension) of 0.19 mm.

The shape of main surface 80a is a rectangle including first side 81 extending along the first direction, second side 82 disposed on the opposite side of first side 81 across semiconductor laser element 20 and extending along the first direction, and third side 83 and fourth side 84 perpendicular to first side 81 and second side 82.

Main surface 80a includes second bonding regions B21 through B24 to which second wires 71 through 74 are respectively bonded. Each second bonding region is disposed between semiconductor laser element 20 and second side 82 of main surface 80a. In the present embodiment, second bonding regions B21 through B24 are aligned spaced at equal intervals and parallel to the first direction. Second bonding regions B21 through B24 are spaced at 0.15 mm intervals. The distance from third side 83 of main surface 80a to the center of second bonding region B21 is 0.23 mm, and the distance from fourth side 84 to the center of second bonding region B24 is 0.25 mm. The distance from second side 82 of main surface 80a to each second bonding region is 0.07 mm.

Metal film 86 is an electrically conductive film that is connected to one electrode of semiconductor laser element 20. Metal film 86 is not particularly limited as long as it is an electrically conductive film. In the present embodiment, metal film 86 includes, in order from main surface 80a of substrate 80, a 0.1 μm thick Ti film, a 0.2 μm thick Pt film, and a 0.5 μm thick Au film. Metal film 86 is not formed in a 0.01 mm wide region at the edge of main surface 80a.

First marks 41 through 44, second marks 51 through 55, third marks 31 and 32, and fourth mark 33 are formed in metal film 86, Forming marks in metal film 86 in this manner eliminates the need to add other components to form marks. Each mark is configured to be visible on main surface 80a. In the present embodiment, each mark is formed by removing a portion of metal film 86 from the Au film to the Ti film to expose main surface 80a from beneath metal film 86. As a result, each mark is visible due to the contrast between (i.e., the difference in reflectance to visible light) between each mark portion and other portions of main surface 80a. The configuration of each mark is not particularly limited as long as it is visible. For example, each mark may be formed by placing another film on metal film 86 that has a different reflectance than metal film 86. The minimum size of each mark is set to a size that allows each mark to be easily formed and visible. Note that each mark does not need to be visible to the naked eye. For example, each mark may be visible under a microscope. The maximum size of each mark is set to secure sufficient space for bonding each wire, etc.

Each first mark is disposed between semiconductor laser element 20 and first side 81 of main surface 80a. In the present embodiment, each first mark has a quadrangular shape. The width of each first mark in the first direction is approximately 20 μm to 70 μm, inclusive. The length of each first mark in the second direction perpendicular to the first direction is approximately 20 μm to 140 μm, inclusive, Each first mark has a quadrangular shape and is in contact with the outer edge of metal film 86 on the first side 81 side of main surface 80a (in other words, the outer edge of metal film 86 that is closest to first side 81). Stated differently, each first mark is a notch formed inwardly from the first side 81 side end portion of metal film 86.

In the top view of main surface 80a, first marks 41 through 44 are disposed directly below first wires 61 through 64, respectively. In the present embodiment, the distances from third side 83 of main surface 80a to the first direction centers of first marks 41 through 44 are 0.205 mm, 0.355 mm, 0.555 mm, and 0.705 mm, respectively. The distance from fourth side 84 of main surface 80a to first mark 44 is 0.225 mm.

Each second mark is disposed between semiconductor laser element 20 and second side 82 of main surface 80a. In the present embodiment, each second mark has a triangular shape. More specifically, each second mark has the shape of an isosceles right triangle and is formed at an angle such that the hypotenuse is parallel to second side 82 of main surface 80*a*. The length of the two perpendicular sides of each second mark is approximately 25 μm to 100 μm, inclusive. Each second mark has a triangular shape and is in contact with the outer edge of metal film 86 on the second side 82 side of main surface 80*a*. Stated differently, each second mark is a notch formed inwardly from the second side 82 side end portion of metal film 86. Disposing each second mark at an outer edge of metal film 86 in this manner prevents the second marks from interfering with the second bonding regions. Moreover, since each second mark is disposed at an outer edge of metal film 86, the second marks can be separated from the second bonding regions to a relatively large extent, and the effect that forming each second mark has on the current flowing in metal film 86 can be reduced.

In the present embodiment, the distances from third side 83 of main surface 80*a* to the first direction centers of second marks 51 through 55 are 0.15 mm, 0.30 mm, 0.45 mm, 0.60 mm, and 0.75 mm, respectively. Second marks 51 through 55 are thus arranged spaced at equal intervals. The distance from fourth side 84 of main surface 80*a* to second mark 55 is 0.17 mm.

Each third mark is a mark formed on main surface 80*a*, and in the top view of main surface 80*a*, each third mark overlaps a straight line passing through and parallel to front end face 20F of semiconductor laser element 20. This enables the alignment of front end face 20F of semiconductor laser element 20 based on each third mark. In the present embodiment, the distance from third side 83 of main surface 80*a* to the center of each third mark is 0.065 mm. The distance from first side 81 of main surface 80*a* to the center of third mark 31 and the distance from second side 82 to the center of third mark 32 are both 0.07 mm. Each third mark is thus disposed closer to the third side 83 of main surface 80*a* than any of the first and second marks are.

Although the shape of each third mark is not particularly limited, in the present embodiment, each third mark has a square shape and each side of the square is inclined at 45 degrees relative to each side of main surface 80*a*. The length of each side of each third mark is approximately 30 μm to 70 μm, inclusive. Although two third marks 31 and 32 are exemplified as being formed in the present embodiment, one third mark may be formed, and third marks 31 and 32 may not be formed.

Fourth mark 33 is a mark formed on main surface 80*a*, and in the top view of main surface 80*a*, fourth mark 33 overlaps a straight line passing through and parallel to rear end face 20R of semiconductor laser element 20. This enables the alignment of rear end face 20R of semiconductor laser element 20 based on fourth mark 33. In the present embodiment, the distance from fourth side 84 of main surface 80*a* to the center of fourth mark 33 is 0.065 mm. The distance from second side 82 of main surface 80*a* to the center of fourth mark 33 is 0.07 mm.

Although the shape of fourth mark 33 is not particularly limited, in the present embodiment, fourth mark 33 has a square shape and each side of the square is inclined at 45 degrees relative to each side of main surface 80*a*. The length of one side of fourth mark 33 is approximately 30 μm to 70 μm, inclusive.

Although one fourth mark 33 is exemplified as being formed in the present embodiment, two fourth marks may be formed, and no fourth mark 33 may be formed.

In the present embodiment, each second bonding region is disposed on a straight line connecting third mark 32 and fourth mark 33. By arranging third mark 32 and fourth mark 33 on a straight line passing through the appropriate placement position of each second bonding region, it is possible to arrange each second bonding region in the appropriate position. By inspecting whether or not each second bonding region is arranged on a straight line connecting third mark 32 and fourth mark 33 in the top view of main surface 80*a*, it is possible to determine whether the position of the second bonding region is acceptable or not acceptable.

As illustrated in FIG. 3, semiconductor laser device 10 according to the present embodiment includes a plurality of first mark portions M11 through M14 and a plurality of second mark portions M21 through M24. First mark portions M11 through M14 include first marks 41 through 44, respectively. In other words, first mark portion M11 includes first mark 41, first mark portion M12 includes first mark 42, first mark portion M13 includes first mark 43, and first mark portion M14 includes first mark 44. Second mark portion M21 includes second marks 51 and 52, second mark portion M22 includes second marks 52 and 53, second mark portion M23 includes second marks 53 and 54, and second mark portion M24 includes second marks 54 and 55.

First mark portions M11 through M14 are mutually different. Stated differently, at least part of the one or more first marks included in each of first mark portions M11 through M14 is different, Second mark portions M21 through M24 are mutually different. Stated differently, at least part of the one or more second marks included in each of second mark portions M21 through M24 is different.

Although not illustrated in the drawings, a metal film is also formed on the main surface that is on the opposite side of main surface 80*a* of substrate 80. In the present embodiment, a 0.1 μm thick Ti film, a 0.2 μm thick Pt film, and a 0.5 μm thick Au film are formed in the listed order from the substrate 80 side.

Substrate 80 is bonded to one surface of stem 93 by bonding member 87. The configuration of bonding member 87 is not particularly limited. In the present embodiment, bonding member 87 includes a 4.0 μm thick solder film comprising AuSn.

As illustrated in FIG. 2, first wires 61 through 64 are electrically conductive wires for supplying current that connect lead pin 91 to semiconductor laser element 20. As illustrated in FIG. 3, first wires 61 through 64 are bonded to first bonding regions B11 through B14 of the top surface of semiconductor laser element 20, respectively. First wires 61 through 64 respectively include, at end portions on the semiconductor laser element 20 side, first ball portions 61B through 64B having a hemispherical shape. First ball portions 61B through 64B are bonded to the top surface of semiconductor laser element 20 at first bonding regions B11 through B14, respectively. In the top view of main surface 80*a*, each first wire intersects first side 81 of main surface 80*a*.

The material and structure of each first wire is not particularly limited. In the present embodiment, each first wire is a 20 μm diameter wire comprising Au. The diameter of each first ball portion is approximately 55±15 μm. The diameter of each first wire may be greater than or equal to 15 μm and 50 μm or less. The diameter of each first ball portion may be greater than or equal to 30 μm and 100 μm or less.

As illustrated in FIG. 2, second wires 71 through 74 are wires for supplying current that connect lead pin 92 to main surface 80*a* of substrate 80. As illustrated in FIG. 3, second wires 71 through 74 are bonded to second bonding regions B21 through B24 of main surface 80*a* of substrate 80, respectively. Second wires 71 through 74 respectively include, at end portions on the main surface 80*a* side, second ball portions 71B through 74B having a hemispherical shape. Second ball portions 71B through 74B are bonded to main surface 80a at second bonding regions B21 through B24, respectively. In the top view of main surface 80a, each second wire intersects second side 82 of main surface 80a.

The material and structure of each second wire is not particularly limited. In the present embodiment, each second wire is a 20 μm diameter wire comprising Au. The diameter of each second ball portion is approximately 55±15 μm. The diameter of each second wire may be greater than or equal to 15 μm and 50 μm or less. The diameter of each second ball portion may be greater than or equal to 30 μm and 100 μm or less.

1-2. Configuration of First Wire Group and Second Wire Group

Figure 4:
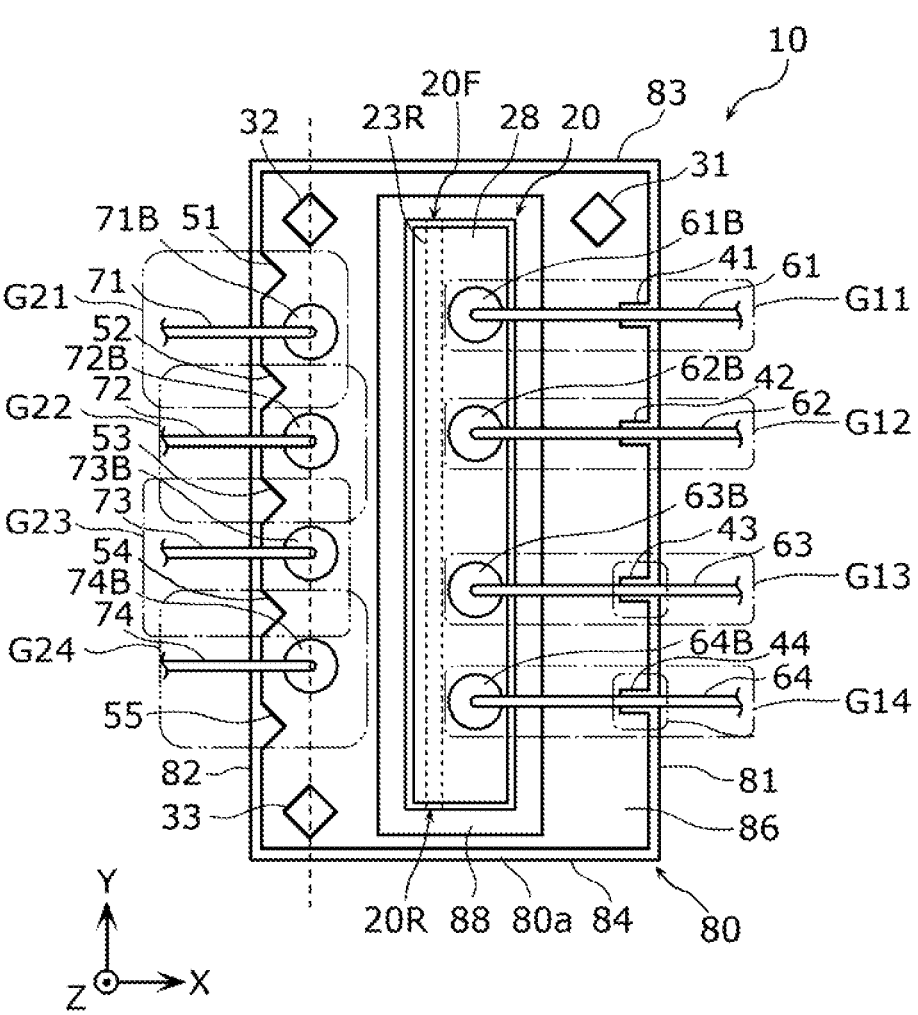
FIG. 4 is a schematic top view illustrating configurations of a plurality of first wire groups and a plurality of second wire groups of the semiconductor laser device according to Embodiment 1.

Semiconductor laser device 10 according to the present embodiment includes a plurality of first wire groups and a plurality of second wire groups. The configurations of each of the plurality of first wire groups and the plurality of second wire groups according to the present embodiment will be described below with reference to FIG. 4. FIG. 4 is a schematic top view illustrating configurations of a plurality of first wire groups G11 through G14 and a plurality of second wire groups G21 through G24 of semiconductor laser device 10 according to the present embodiment.

As illustrated in FIG. 4, semiconductor laser device 10 according to the present embodiment includes a plurality of first wire groups G11 through G14 and a plurality of second wire groups G21 through G24.

First wire group G11 includes first wire 61 and first mark portion M11 (i.e., first mark 41). First wire group G12 includes first wire 62 and first mark portion M12 (i.e., first mark 42). First wire group G13 includes first wire 63 and first mark portion M13 (i.e., first mark 43), First wire group G14 includes first wire 64 and first mark portion M14 (i.e., first mark 44).

In the top view of main surface 80a of substrate 80, first wires 61 through 64 are disposed at positions overlapping first mark portions M11 through M14, respectively. Stated differently, in the top view of main surface 80a, first wires 61 through 64 overlap first marks 41 through 44, respectively. In the present embodiment, in the top view of main surface 80a, first marks 41 through 44 are disposed directly below first wires 61 through 64, respectively.

This allows the plurality of first wires to be placed at appropriate positions by placing the first mark portions at appropriate placement positions for the respective first wires in the top view of main surface 80a. By inspecting whether the first wires overlap the respective first mark portions in the top view of main surface 80a, it is possible to determine whether the position of each of the plurality of first wires 61 through 64 is acceptable or not acceptable.

In the present embodiment, the plurality of first mark portions M11 through M14 are mutually different. Accordingly, the plurality of first wires 61 through 64 are arranged in accordance with the positions of the plurality of first mark portions that are mutually different. In addition, only one first wire overlaps each of the plurality of first mark portions. This reduces the possibility of a plurality of first wires being concentrated or contacting each other.

Second wire group G21 includes second wire 71 and second mark portion M21 (i.e., second marks 51 and 52). Second wire group G22 includes second wire 72 and second mark portion M22 (i.e., second marks 52 and 53). Second wire group G23 includes second wire 73 and second mark portion M23 (i.e., second marks 53 and 54). Second wire group G24 includes second wire 74 and second mark portion M24 (i.e., second marks 54 and 55).

Figure 5:
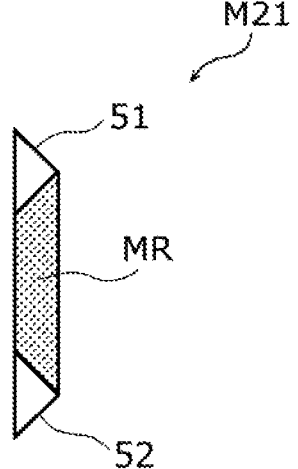
FIG. 5 is a schematic diagram illustrating the region indicated by a second mark portion according to Embodiment 1.

In the top view of main surface 80a of substrate 80, second wires 71 through 74 are disposed at positions overlapping second mark portions M21 through M24, respectively. The positional relationship between each group of a second wire and two second marks in the case where each second mark portion includes two second marks will be described with reference to FIG. 5. FIG. 5 is a schematic diagram illustrating the region indicated by second mark portion M21 according to the present embodiment. FIG. 5 illustrates second mark portion M21 in the top view of main surface 80a.

As illustrated in FIG. 5, in the top view of main surface 80a, second mark portion M21 includes two second marks 51 and 52 disposed spaced apart from each other and a line segment connecting the two second marks 51 and 52. Stated differently, second mark portion M21 includes each of the regions of second marks 51 and 52 and region MR that is a set of line segments connecting second mark 51 and second mark 52. Stated further differently, second mark portion M21 includes an envelope enclosing second mark 51 and second mark 52 and the region contained therein. The regions included in second mark portions M22 through M24 are also defined in the same manner as second mark portion M21. As illustrated in FIG. 4, in the present embodiment, in each second mark portion, the two second marks are spaced apart with a second wire between them.

By placing a second mark portion at an appropriate placement position of each second wire in the top view of main surface 80a, the plurality of second wires 71 through 74 can be placed at appropriate positions. By inspecting whether the second wires overlap the respective second mark portions in the top view of main surface 80a, it is possible to determine whether the position of each of the plurality of second wires 71 through 74 is acceptable or not acceptable.

In the present embodiment, the plurality of second mark portions M21 through M24 are mutually different. Accordingly, the plurality of second wires 71 through 74 are arranged in accordance with the positions of the plurality of second mark portions that are mutually different. In addition, only one second wire overlaps each of the plurality of second mark portions. This reduces the possibility of a plurality of second wires being concentrated or contacting each other.

1-3. Stacked Structure of Semiconductor Laser Element

Figure 6:
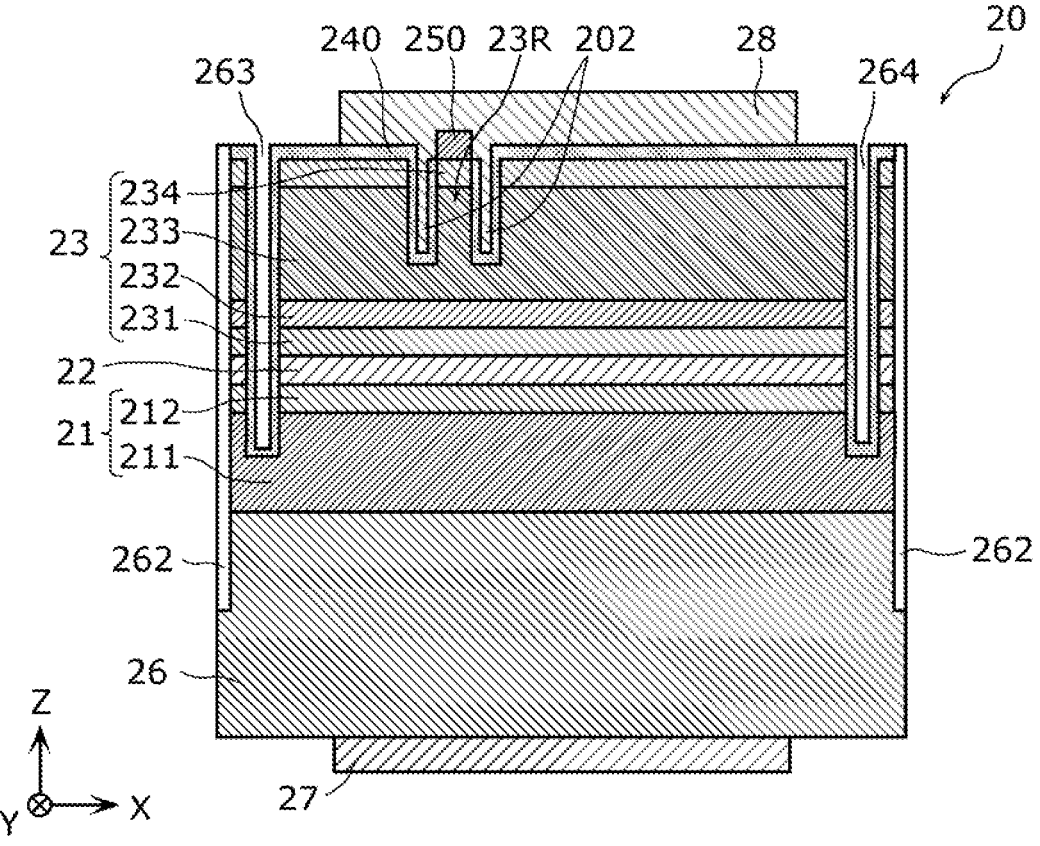
FIG. 6 is a schematic cross sectional view illustrating a configuration of the semiconductor laser element according to Embodiment 1 before being bonded to the substrate.

Next, the stacked structure of semiconductor laser element 20 according to the present embodiment will be described with reference to FIG. 6. FIG. 6 is a schematic cross sectional view illustrating a configuration of semiconductor laser element 20 according to the present embodiment before being bonded to substrate 80. FIG. 6 illustrates a cross section taken perpendicular to the first direction (i.e., the lengthwise direction of the resonator) of semiconductor laser element 20 when viewed from the rear end face 20R side. Accordingly, when semiconductor laser element 20 is bonded to substrate 80 as illustrated in FIG. 3, in FIG. 6, the right side of semiconductor laser element 20 is arranged on first side 81 side of substrate 80, and the left side of semiconductor laser element 20 is arranged on second side 82 side of substrate 80.

Semiconductor laser element 20 is, for example, a nitride semiconductor laser element, and before being bonded to substrate 80, includes substrate 26, first semiconductor layer 21, active layer 22, second semiconductor layer 23, current blocking layer 240, p-side ohmic electrode 250, and electrodes 27 and 28, as illustrated in FIG. 6.

Substrate 26 is, for example, a GaN substrate comprising GaN, In the present embodiment, a hexagonal n-type GaN substrate is used as substrate 26.

First semiconductor layer 21 includes, for example, n-type cladding layer 211 comprising n-type AlGaN, and n-side guiding layer 212 comprising GaN formed on n-type cladding layer 211.

Active layer 22 is an undoped quantum well active layer, for example, an active layer having a quantum well structure in which quantum well layers comprising InGaN and quantum barrier layers comprising InGaN are alternately stacked.

Second semiconductor layer 23 includes, for example, p-side guiding layer 231 comprising InGaN, p-type electron barrier layer (overflow inhibition layer) 232 formed on p-side guiding layer 231, p-type cladding layer 233 comprising p-type AlGaN formed on p-type electron barrier layer 232, p-type cladding layer 233 comprising p-type AlGaN formed on p-type electron barrier layer 232, and p-type contact layer 234 comprising p-type GaN formed on p-type cladding layer 233.

As illustrated in FIG. 6, semiconductor laser element 20 includes ridge portion 23R extending in the lengthwise direction of the resonator (i.e., in the Y-axis direction). Ridge portion 23R functions as a current injection region and an optical waveguide in semiconductor laser element 20. As illustrated in FIG. 6, ridge portion 23R is formed in second semiconductor layer 23.

More specifically, ridge portion 23R is formed by digging, into second semiconductor layer 23, two openings 202 extending in the lengthwise direction of the resonator, Stated differently, ridge portion 23R is sandwiched between two openings 202 formed in second semiconductor layer 23, In the present embodiment, ridge portion 23R is formed by digging into p-type cladding layer 233 and p-type contact layer 234.

As illustrated in FIG. 6, except for the portion on ridge portion 23R, the top of second semiconductor layer 23 (in the present embodiment, the top of p-type contact layer 234) is covered by current blocking layer 240 comprising $SiO_2$. Stated differently, current blocking layer 240 is formed so as to include an opening on p-type contact layer 234.

P-side ohmic electrode 250 and electrode 28 are formed above second semiconductor layer 23. P-side ohmic electrode 250 is formed in the opening of current blocking layer 240. Electrode 28 is formed on p-side ohmic electrode 250. P-side ohmic electrode 250 comprises, for example, Pd and Pt, and electrode 28 comprises, for example, Au.

Electrode 27 is formed on the lower surface of substrate 26 (i.e., the surface opposite the surface on the electrode 28 side). Electrode 27 comprises, for example, Au.

As illustrated in FIG. 6, in semiconductor laser element 20 according to the present embodiment, the center line of ridge portion 23R is at a position displaced in the second direction (the X-axis direction) from the widthwise center of semiconductor laser element 20. Stated differently, ridge portion 23R is disposed at a position offset in the second direction (the X-axis direction).

In the present embodiment, the position of ridge portion 23R is offset in the negative direction of the X-axis (on the second side 82 side of substrate 80 when bonded to substrate 80 (see FIG. 3)). Accordingly, when each first bonding region to which a first wire is bonded is disposed in a region other than directly above ridge portion 23R, the width of each first bonding region in the X-axis direction can be enlarged compared to when ridge portion 23R is disposed in the center in the X-axis direction. Each first bonding region is offset in the positive direction of the X-axis (on the first side 81 side of substrate 80 when bonded to substrate 80 (see FIG. 3)) from the X-axis direction center of semiconductor laser element 20.

Groove 262 is formed in a side surface portion of the X-axis direction end portion of semiconductor laser element 20. Groove 262 is a groove for element separation that is used when semiconductor laser element 20 is diced. Groove 262 reaches from the semiconductor stacked body side to substrate 26.

Grooves 263 and 264 that reach from second semiconductor layer 23 to first semiconductor layer 21 are formed in the semiconductor stacked body of semiconductor laser element 20, Grooves 263 and 264 are guide grooves used when forming groove 262.

Figure 7:
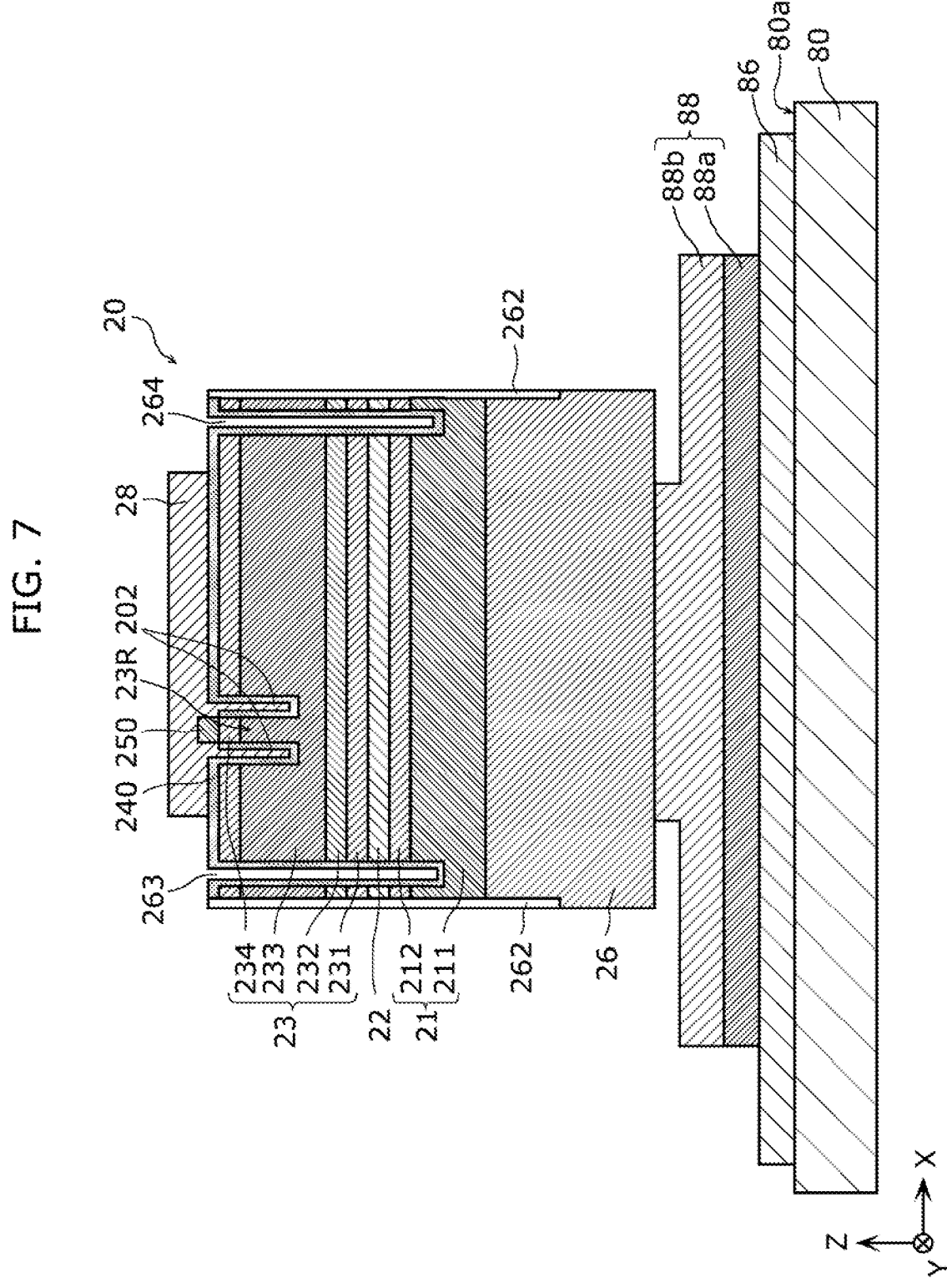
FIG. 7 is a schematic cross sectional view illustrating a configuration of the semiconductor laser element according to Embodiment 1 after being bonded to the substrate.

Next, the configuration of semiconductor laser element 20 according to the present embodiment after being bonded to substrate 80 will be described with reference to FIG. 7. FIG. 7 is a schematic cross sectional view illustrating a configuration of semiconductor laser element 20 according to the present embodiment after being bonded to substrate 80. FIG. 7 illustrates a cross section taken perpendicular to the first direction (i.e., the lengthwise direction of the resonator) of semiconductor laser element 20.

As illustrated in FIG. 7, metal film 86 is formed on main surface 80a of substrate 80. Semiconductor laser element 20 is bonded to metal film 86 on main surface 80a of substrate 80 by bonding member 88. In the present embodiment, bonding member 88 includes Pt film 88a and solder film 88b. When bonding semiconductor laser element 20 to main surface 80a via bonding member 88, electrode 27 comprising Au and the solder film comprising AuSn that are included in semiconductor laser element 20 are heated and melted. When these layers are cooled and solidify, they are united to form solder film 88b, which is a eutectic alloy.

1-4. Semiconductor Laser Device Manufacturing Method

Next, the manufacturing method of the semiconductor laser device 10 according to the present embodiment will be described with reference to FIG. 8 through FIG. 11. FIG. 8 through FIG. 11 are schematic front views illustrating processes of the manufacturing method of semiconductor laser device 10 according to the present embodiment.

Figure 8:
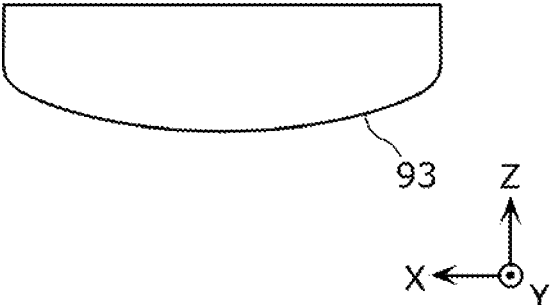
FIG. 8 is a schematic front view illustrating a first process of a manufacturing method of the semiconductor laser device according to Embodiment 1.

First, as illustrated in FIG. 8, stem 93 is prepared. Although not illustrated, stem 93 is erected on base 94. Lead pins 91, 92 and 95 are also erected on base 94.

Figure 9:
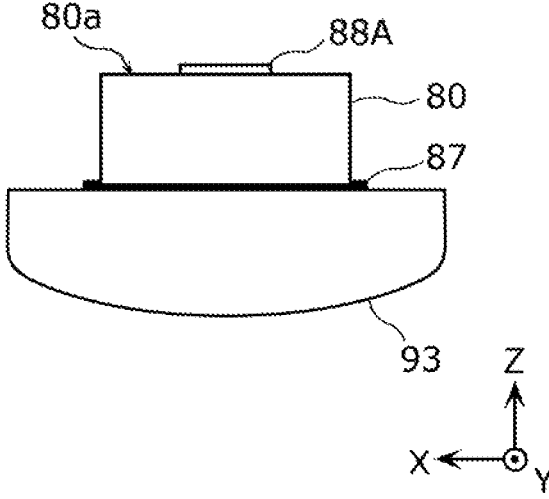
FIG. 9 is a schematic front view illustrating a second process of the manufacturing method of the semiconductor laser device according to Embodiment 1.

Next, as illustrated in FIG. 9, substrate 80 is bonded to the top surface of stem 93 using bonding member 87. Here, bonding member 88A is disposed on main surface 80a of substrate 80. Before semiconductor laser element 20 is bonded, bonding member 88A includes two layers of a Pt film and a solder film comprising AuSn, which are stacked in order from the main surface 80a side.

Figure 10:
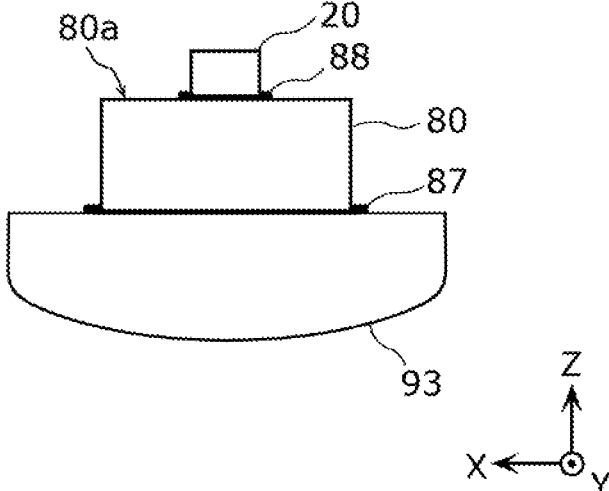
FIG. 10 is a schematic front view illustrating a third process of the manufacturing method of the semiconductor laser device according to Embodiment 1.

Then, as illustrated in FIG. 10, semiconductor laser dement 20 is bonded to main surface 80a of substrate 80. More specifically, semiconductor laser dement 20 is placed on main surface 80a so that, in the top view of main surface 80a, a straight line passing through and parallel to front end face 20F of semiconductor laser element 20 overlaps third marks 31 and 32 formed on main surface 80a (see FIG. 3). Thereafter, electrode 27 comprising Au of semiconductor laser element 20 and the solder film comprising AuSn of bonding member 88A are melted by heating semiconductor laser element 20 and substrate 80 and subsequently cooled to produce solder film 88b, which is a eutectic alloy of bonding member 88 (see FIG. 7), and bond substrate 80 and semiconductor laser element 20. Here, semiconductor laser dement 20 is junction-up mounted.

Figure 11:
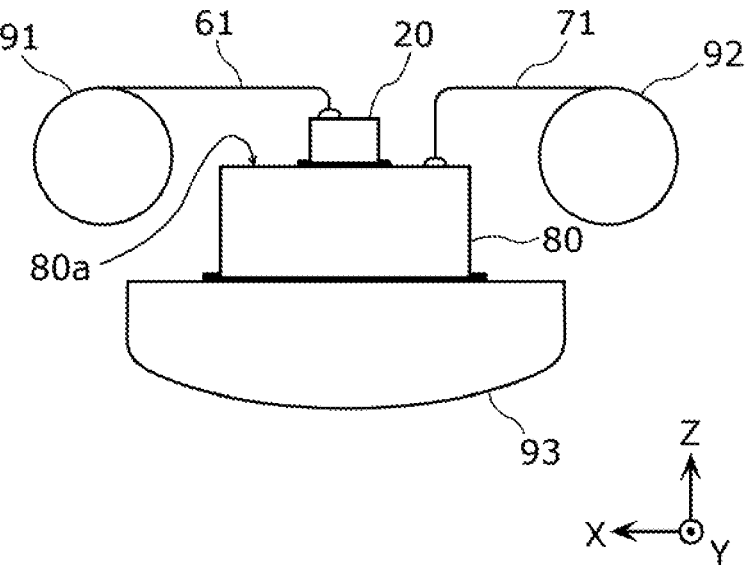
FIG. 11 is a schematic front view illustrating a fourth process of the manufacturing method of the semiconductor laser device according to Embodiment 1.

Next, as illustrated in FIG. 11, lead pin 91 and semiconductor laser element 20 are connected by first wire 61. Although not illustrated in FIG. 11, lead pin 91 and semiconductor laser element 20 are &so connected by first wires 62 through 64. More specifically, first wires 61 through 64 are connected to lead pin 91 and first bonding regions B11 through B14 of semiconductor laser dement 20, respectively (see FIG. 3). Lead pin 92 and main surface 80a of substrate 80 are connected by second wire 71. Although not illustrated in FIG. 11, lead pin 92 and main surface 80a are also connected by second wires 72 through 74. More specifically, second wires 71 through 74 are connected to lead pin 92 and second bonding regions B21 through B24 of main surface 80a, respectively (see FIG. 3). Here, when connecting the wires to the bonding regions, the connection position of each wire may be adjusted with reference to its corresponding mark. For example, as illustrated in FIG. 3, first wires 61 through 64 connected to first bonding regions B11 through B14 connect to lead pin 91 through positions overlapping first mark portions M11 through M14, specifically, directly above first marks 41 through 44, in the top view of main surface 80a of substrate 80. Second wires 71 through 74 connected to second bonding regions B21 through B24 connect to lead pin 92 through positions overlapping second mark portions M21 through M24, specifically, directly above the separated regions connecting second marks 51 and 52, second marks 52 and 53, second marks 53 and 54, and second marks 54 and 55, in the top view of main surface 80a of substrate 80.

Semiconductor laser device 10 is manufactured as described above.

Semiconductor laser device 10 may be provided with a cap. The cap is a cover that covers stem 93, substrate 80, semiconductor laser element 20, and the portions of lead pin 91 and 92 adjacent to stem 93.

1-5. Semiconductor Laser Device Inspection Method

Next, an inspection method of semiconductor laser device 10 according to the present embodiment will be described. The manufactured semiconductor laser device 10 is inspected to see whether semiconductor laser element 20 is arranged so that a straight line passing through and parallel to front end face 20F of semiconductor laser element 20 and the third marks overlap in the top view of main surface 80a, and inspection passes when the straight line and the third marks overlap.

The manufactured semiconductor laser device 10 is inspected to see whether the first wires are disposed overlapping the respective first mark portions and whether the second wires are disposed overlapping the respective second mark portions in the top view of main surface 80a, and inspection passes when all of the wires overlap their corresponding mark portions.

It is additionally possible to determine that inspection passes when each second bonding region is located on a line segment connecting third mark 32 and fourth mark 33.

Embodiment 2

Next, the semiconductor laser device according to Embodiment 2 will be described. The semiconductor laser device according to the present embodiment differs from semiconductor laser device 10 according to Embodiment 1 mainly in regard to the configuration of the semiconductor laser element and the mounting configuration of the semiconductor laser element. Hereinafter, the semiconductor laser device according to the present embodiment will be described focusing on the differences from semiconductor laser device 10 of Embodiment 1.

2-1. Overall Configuration

Figure 12:
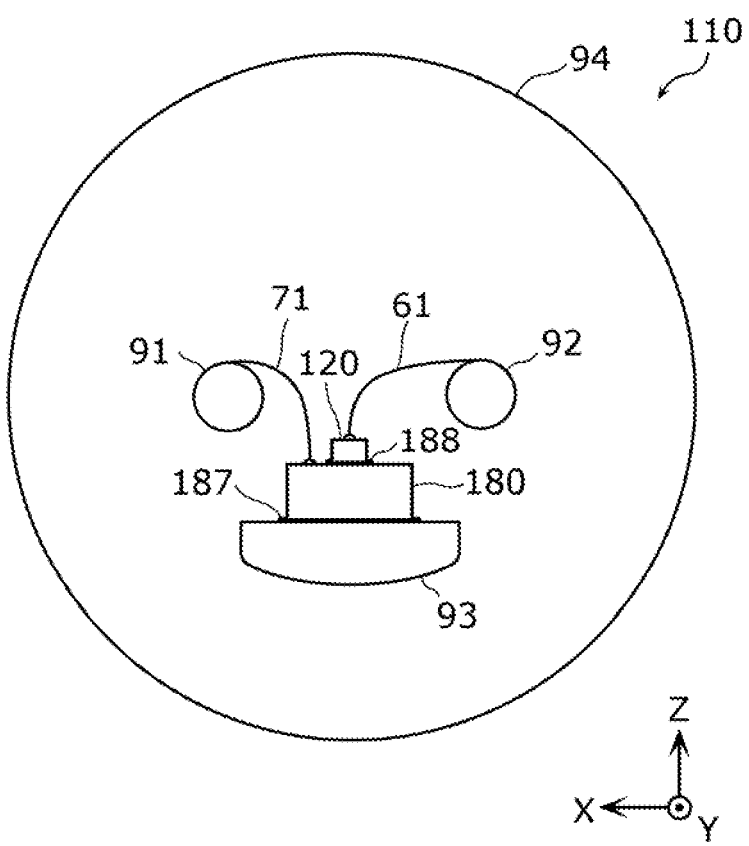
FIG. 12 is a schematic front view illustrating the overall configuration of a semiconductor laser device according to Embodiment 2.
Figure 13:
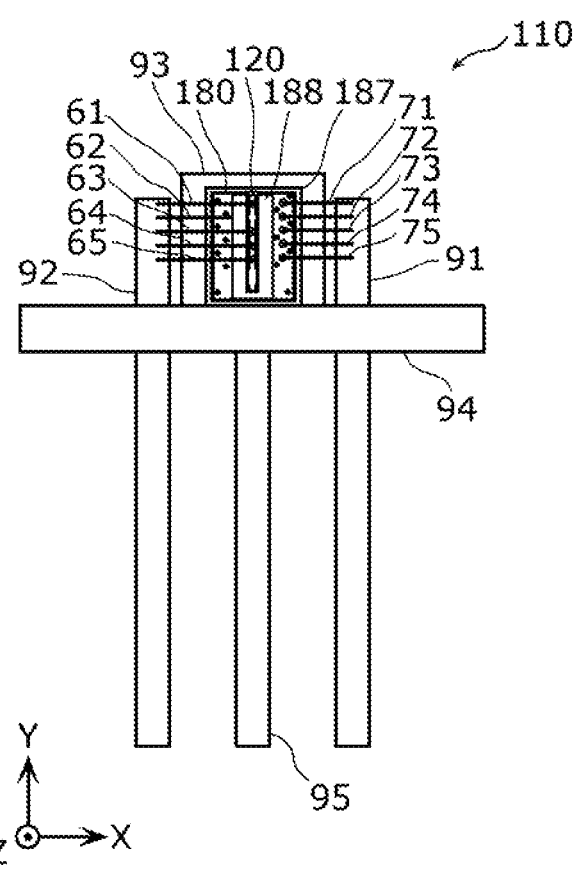
FIG. 13 is a schematic top view illustrating the overall configuration of the semiconductor laser device according to Embodiment 2.
Figure 14:
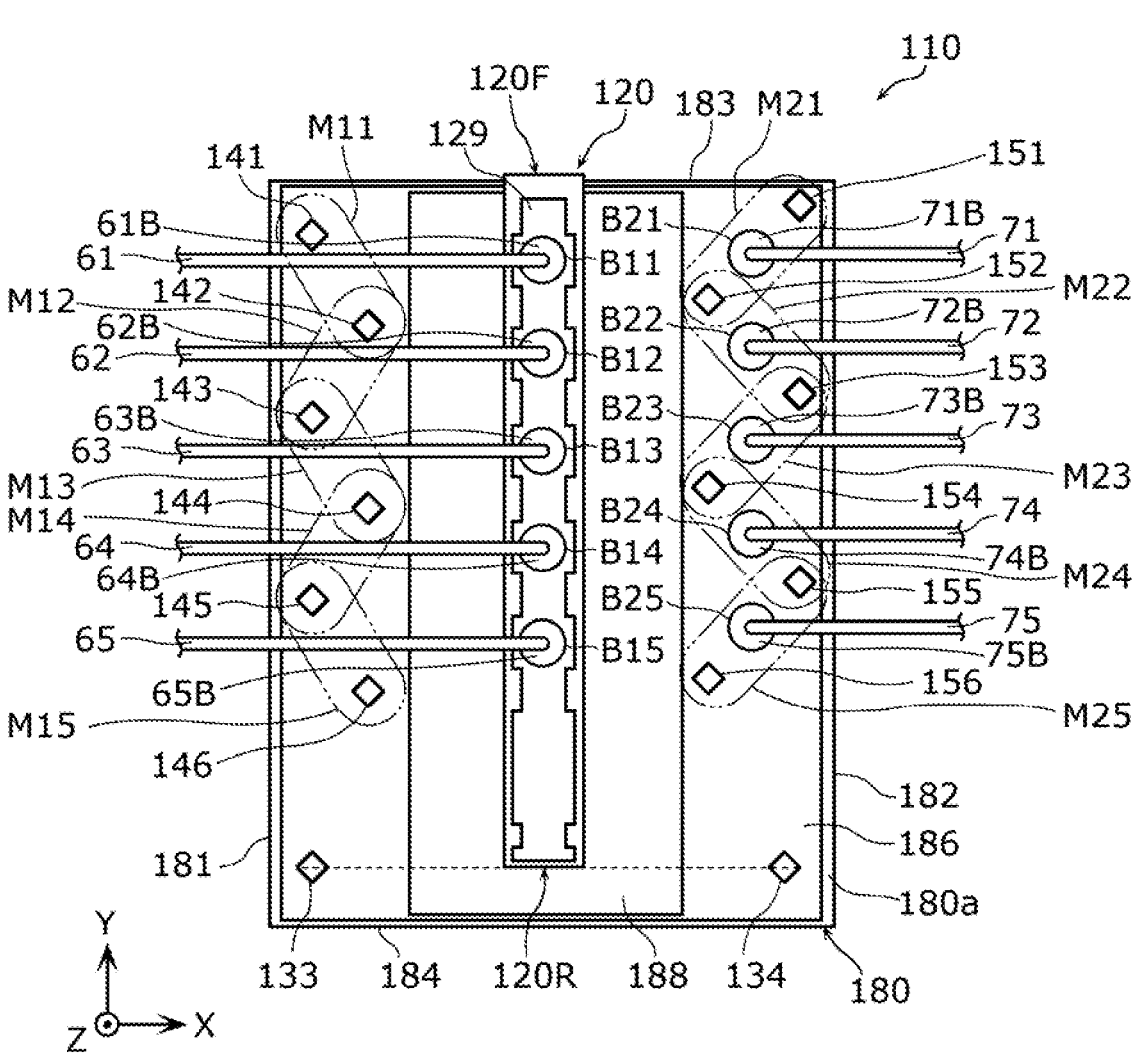
FIG. 14 is a schematic top view illustrating a configuration of a semiconductor laser element and a substrate according to Embodiment 2.

First, the overall configuration of semiconductor laser device 110 according to the present embodiment will be described with reference to FIG. 12 through FIG. 14. FIG. 12 and FIG. 13 are schematic front and top views, respectively, illustrating the overall configuration of semiconductor laser device 110 according to the present embodiment. FIG. 14 is a schematic top view illustrating a configuration of semiconductor laser element 120 and substrate 180 according to the present embodiment.

Semiconductor laser device 110 is a device that emits a laser beam and, as illustrated in FIG. 12 and FIG. 13, includes substrate 180 and semiconductor laser element 120. As illustrated in FIG. 13, semiconductor laser device 110 further includes first wires 61 through 65, second wires 71 through 75, lead pins 91, 92, and 95, stem 93, and base 94. Although not illustrated in FIG. 12 through FIG. 14, semiconductor laser device 110 may include a cap that covers the periphery of semiconductor laser element 120, substrate 180, and stem 93.

As illustrated in FIG. 14, semiconductor laser element 120 is disposed on main surface 180a of substrate 180 and includes a resonator extending along a first direction among in-plane directions of main surface 180a. In the present embodiment, the resonator of semiconductor laser element 120 is formed with front end face 120F and rear end face 120R. Front end face 120F is the end face on the end of semiconductor laser element 120 from which the laser beam is emitted, and has a lower reflectance to the laser beam than rear end face 1208. Rear end face 120R is a highly reflective end face that reflects the laser beam of semiconductor laser element 120. The first direction is the direction in which the laser beam resonates, i.e., the direction in which the laser beam is emitted, and is parallel to the Y-axis direction in each figure. Front end face 120F is disposed outside the outer edge of substrate 180 when substrate 180 is viewed from the top.

Electrode 129 is formed on the top surface of semiconductor laser element 120 (i.e., the surface opposite the surface bonded to substrate 180), The top surface of semiconductor laser element 120 includes first bonding regions B11 through B15 to which first wires 61 through 65 are respectively bonded. Semiconductor laser element 120 according to the present embodiment is junction-down mounted on main surface 180a of substrate 180. In other words, semiconductor laser element 120 is mounted to main surface 180a on the semiconductor stacked body side of semiconductor laser element 120 rather than on the substrate side. In this case, unlike semiconductor laser device 10 according to Embodiment 1, the entire width (i.e., the X-axis direction dimension) of electrode 129 can be used as each first bonding region.

In the present embodiment, first bonding regions 1311 through B15 are arranged in parallel in the first direction. The distances from front end face 120F of semiconductor laser element 120 to the respective centers of first bonding regions B11 through B15 are 0.12 mm, 0.29 mm, 0.46 mm, 0.63 mm, and 0.80 mm, respectively. First bonding regions B11 through B15 are thus arranged spaced at equal intervals with a center-to-center distance of 0.17 mm.

Semiconductor laser element 120 is bonded to metal film 186 on main surface 180a of substrate 180 by bonding member 188. The configuration of bonding member 188 is not particularly limited. In the present embodiment, bonding member 188 includes, in order from the metal film 186 side, a 0.32 μm thick Pt film and a 2.5 μm thick solder film comprising AuSn. The length of bonding member 188 in the second direction (i.e., the X-axis direction) is approximately 0.5 mm.

The size and structure of semiconductor laser element 120 are not particularly limited. In the present embodiment, the length of the resonator of semiconductor laser element 120 is 1200 μm, the width in second direction is 150 μm, and the thickness (the Z-axis direction dimension) is 85 μm.

The stacked structure of semiconductor laser element 120 will be described later.

Substrate 180 is a submount on which semiconductor laser element 120 is provided. Although the material included in substrate 180 is not particularly limited so long as the material has a high thermal conductivity, in the present embodiment, the material is SiC.

As illustrated in FIG. 14, substrate 180 includes main surface 180*a* on which metal film 186 is formed. Although the size and shape of substrate 180 are not particularly limited, in the present embodiment, substrate 180 has a rectangular shape with a length (i.e., a Y-axis direction dimension) of 1.3 mm, a width (i.e., an X-axis direction dimension) of 1.0 mm, and a thickness (i.e., a Z-axis direction dimension) of 0.20 mm.

The shape of main surface 180*a* is a rectangle including first side 181 extending along the first direction, second side 182 disposed on the opposite side of first side 181 across semiconductor laser element 120 and extending along the first direction, and third side 183 and fourth side 184 perpendicular to first side 181 and second side 182.

Main surface 180*a* includes second bonding regions B21 through B25 to which second wires 71 through 75 are respectively bonded. Each second bonding region is disposed between semiconductor laser element 120 and second side 182 of main surface 180*a*. In the present embodiment, second bonding regions 321 through 325 are aligned spaced at equal intervals and parallel to the first direction. Second bonding regions 321 through B25 are spaced at 0.15 mm intervals. The distance from third side 183 of main surface 180*a* to the center of second bonding region B21 is 0.13 mm, and the distance from fourth side 184 to the center of second bonding region B25 is 0.57 mm. The distance from the second side of main surface 180*a* to each second bonding region is 0.10 mm. Metal film 186 is an electrically conductive film that is connected to one electrode of semiconductor laser element 120.

Metal film 186 is not particularly limited as long as it is an electrically conductive film. In the present embodiment, metal film 186 includes, in order from main surface 180*a* of substrate 180, a 0.1 μm thick Ti film, a 0.2 μm thick Pt film, and a 0.5 μm thick Au film. Metal film 186 is not formed in a 0.02 mm wide region at the edge of main surface 180*a*.

First marks 141 through 146, second marks 151 through 156, and fourth marks 133 and 134 are formed in metal film 186, Each mark is configured to be visible on main surface 180*a*. In the present embodiment, each mark is formed by removing a portion of metal film 186 from the Au film to the Ti film to expose main surface 180*a* from beneath metal film 186. The configuration of each mark is not particularly limited as long as it is visible. For example, each mark may be formed by placing another film on metal film 186 that has a different reflectance than metal film 186.

Each first mark is disposed between semiconductor laser element 120 and first side 181 of main surface 180*a*. In the present embodiment, each first mark has a square shape and each side of the square is inclined at 45 degrees relative to each side of main surface 180*a*. The length of each side of each first mark is approximately 30 μm to 100 μm, inclusive.

In the present embodiment, the distances from third side 183 of main surface 180*a* to the respective centers of first marks 141 through 146 are 0.05 mm, 0.20 mm, 0.35 mm, 0.50 mm, 0.65 mm, and 0.80 mm, respectively. The distance from fourth side 184 of main surface 180*a* to first mark 146 is 0.50 mm. The distance from first side 181 of main surface 180*a* to the respective centers of first marks 141, 143, and 145 is 0.05 mm, and the distance from first side 181 to the respective centers of first marks 142, 144, and 146 is 0.20 mm. That is, first marks 141 through 146 are arranged in a staggered arrangement (i.e., arranged in a zigzag arrangement) in the first direction.

Each second mark is disposed between semiconductor laser element 120 and second side 182 of main surface 180*a*. In the present embodiment, each second mark has a square shape and each side of the square is inclined at 45 degrees relative to each side of main surface 180*a*. The length of each side of each second mark is approximately 30 μm to 100 μm, inclusive.

In the present embodiment, the distances from third side 183 of main surface 180*a* to the respective centers of second marks 151 through 156 are 0.05 mm, 0.20 mm, 0.35 mm, 0.50 mm, 0.65 mm, and 0.80 mm, respectively. The distance from fourth side 184 of main surface 180*a* to second mark 156 is 0.50 mm. The distance from second side 182 of main surface 180*a* to the respective centers of second marks 151, 153, and 155 is 0.05 mm, and the distance from second side 182 to the respective centers of second marks 152, 154, and 156 is 0.20 mm. That is, second marks 151 through 156 are arranged in a staggered arrangement in the first direction.

Each fourth mark is a mark formed on main surface 180*a*, and in the top view of main surface 180*a*, each fourth mark overlaps with a straight line passing through and parallel to rear end face 120R of semiconductor laser element 120. This enables the alignment of rear end face 120R of semiconductor laser element 120 based on the fourth marks. In the present embodiment, the distance from fourth side 184 of main surface 180*a* to the center of each fourth mark is 0.05 mm. The distance from first side 181 of main surface 180*a* to the center of fourth mark 133 and the distance from second side 182 to the center of fourth mark 134 are both 0.05 mm. Each fourth mark is thus disposed closer to the fourth side 184 of main surface 180*a* than any of the first and second marks are.

Although the shape of each fourth mark is not particularly limited, in the present embodiment, each fourth mark has a square shape and each side of the square is inclined at 45 degrees relative to each side of main surface 180*a*. The length of each side of each fourth mark is approximately 30 μm to 70 μm, inclusive. Although two fourth marks 133 and 134 are exemplified as being formed in the present embodiment, one fourth mark may be formed, and fourth marks 133 and 134 may not be formed.

As illustrated in FIG. 14, semiconductor laser device 110 according to the present embodiment includes a plurality of first mark portions M11 through M15 and a plurality of second mark portions M21 through M25. First mark portion M11 includes first marks 141 and 142, first mark portion M12 includes first marks 142 and 143, first mark portion M13 includes first marks 143 and 144, first mark portion M14 includes first marks 144 and 145, and first mark portion M15 includes first marks 145 and 146.

Second mark portion M21 includes second marks 151 and 152, second mark portion M22 includes second marks 152 and 153, second mark portion M23 includes second marks 153 and 154, second mark portion M24 includes second marks 154 and 155, and second mark portion M25 includes second marks 155 and 156.

First mark portions M11 through M15 are mutually different. Stated differently, at least part of the one or more first marks included in each of first mark portions M11 through M15 is different. Second mark portions M21 through M25 are mutually different. Stated differently, at least part of the one or more second marks included in each of second mark portions M21 through M25 is different.

Although not illustrated in the drawings, a metal film is also formed on the main surface that is on the opposite side of main surface 180a of substrate 180. In the present embodiment, a 0.1 μm thick Ti film, a 0.2 μm thick Pt film, and a 0.5 μm thick Au film are formed in the listed order from the substrate 180 side.

Substrate 180 is bonded to one surface of stem 93 by bonding member 187. The configuration of bonding member 187 is not particularly limited. In the present embodiment, bonding member 187 includes a 4.0 μm thick solder film comprising AuSn.

As illustrated in FIG. 13, first wires 61 through 65 are electrically conductive wires for supplying current that connect lead pin 92 to semiconductor laser element 120. As illustrated in FIG. 14, first wires 61 through 65 are bonded to first bonding regions B11 through B15 of the top surface of semiconductor laser element 120, respectively. First wires 61 through 65 respectively include, at end portions on the semiconductor laser element 120 side, first ball portions 613 through 653 having a hemispherical shape. First ball portions 61B through 65B are bonded to the top surface of semiconductor laser element 120 at first bonding regions 311 through 315, respectively. In the top view of main surface 180a, each first wire intersects first side 181 of main surface 180a.

The material and structure of each first wire is not particularly limited. In the present embodiment, each first wire is a 38 μm diameter wire comprising Au. The diameter of each first ball portion is approximately 85±15 μm. The diameter of each first wire may be greater than or equal to 15 μm and 50 μm or less. The diameter of each first ball portion may be greater than or equal to 30 μm and 100 μm or less.

As illustrated in FIG. 13, second wires 71 through 75 are wires for supplying current that connect lead pin 91 to main surface 80a of substrate 80. As illustrated in FIG. 14, second wires 71 through 75 are bonded to second bonding regions B21 through B25 of main surface 180a of substrate 180, respectively. Second wires 71 through 75 respectively include, at end portions on the main surface 180a side, second ball portions 71B through 75B having a hemispherical shape. Second ball portions 71B through 75B are bonded to main surface 180a at second bonding regions B21 through B25, respectively. In the top view of main surface 180a, each second wire intersects second side 182 of main surface 180a.

The material and structure of each second wire is not particularly limited. In the present embodiment, each second wire is a 38 μm diameter wire comprising Au. The diameter of each second ball portion is approximately 85±15 μm. The diameter of each second wire may be greater than or equal to 15 μm and 50 μm or less. The diameter of each second ball portion may be greater than or equal to 30 μm and 100 μm or less.

2-2. Configuration of First Wire Group and Second Wire Group

Figure 15:
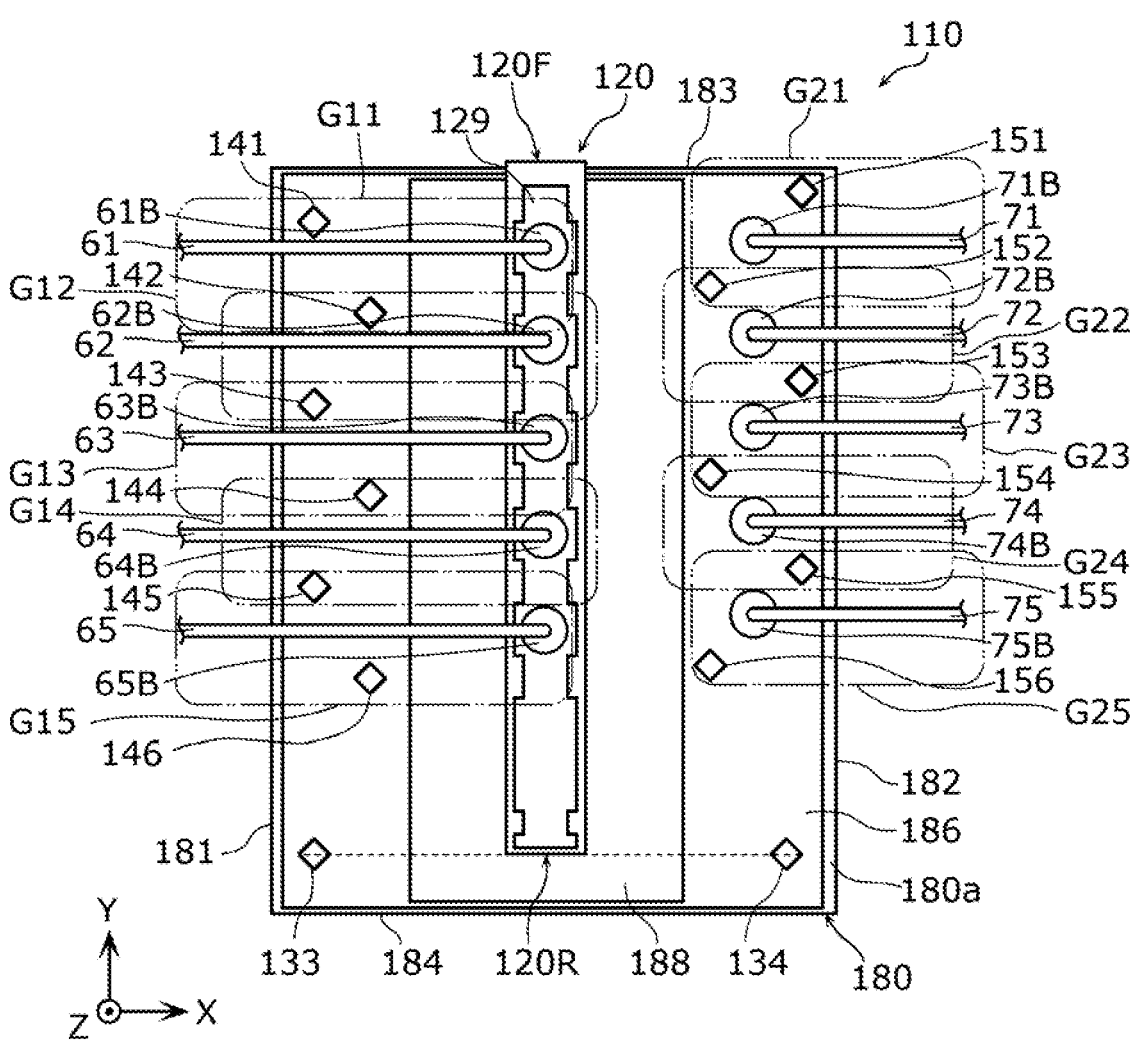
FIG. 15 is a schematic top view illustrating configurations of a plurality of first wire groups and a plurality of second wire groups of the semiconductor laser device according to Embodiment 2.

Just like semiconductor laser device 10 according to Embodiment 1, semiconductor laser device 110 according to the present embodiment also includes a plurality of first wire groups and a plurality of second wire groups. The configurations of each of the plurality of first wire groups and the plurality of second wire groups according to the present embodiment will be described below with reference to FIG. 15. FIG. 15 is a schematic top view illustrating configurations of a plurality of first wire groups G11 through G15 and a plurality of second wire groups G21 through G25 of semiconductor laser device 110 according to the present embodiment.

As illustrated in FIG. 15, semiconductor laser device 110 according to the present embodiment includes a plurality of first wire groups G11 through G15 and a plurality of second wire groups G21 through G25.

First wire group G11 includes first wire 61 and first mark portion M11 (i.e., first marks 141 and 142). First wire group G12 includes first wire 62 and first mark portion M12 (i.e., first marks 142 and 143). First wire group G13 includes first wire 63 and first mark portion M13 (i.e., first marks 143 and 144). First wire group G14 includes first wire 64 and first mark portion M14 (i.e., first marks 144 and 145). First wire group G15 includes first wire 65 and first mark portion M15 (i.e., first marks 145 and 146).

In the top view of main surface 180a of substrate 180, first wires 61 through 65 are disposed at positions overlapping first mark portions M11 through M15, respectively. In the present embodiment, each first mark portion includes, in the top view of main surface 180a, two first marks disposed spaced apart from each other and a line segment connecting the two first marks, and each first wire overlaps a line segment connecting two first marks.

By placing a first mark portion at an appropriate placement position of each first wire in the top view of main surface 180a, the plurality of first wires 61 through 65 can be placed at appropriate positions. By inspecting whether the first wires overlap the respective first mark portions in the top view of main surface 180a, it is possible to determine whether the position of each of the plurality of first wires 61 through 65 is acceptable or not acceptable.

In the present embodiment, the plurality of first mark portions M11 through M15 are mutually different. Accordingly, the plurality of first wires 61 through 65 are arranged in accordance with the positions of the plurality of first mark portions that are mutually different. In addition, only one first wire overlaps each of the plurality of first mark portions. This reduces the possibility of a plurality of first wires being concentrated or contacting each other.

Second wire group G21 includes second wire 71 and second mark portion M21 (i.e., second marks 151 and 152). Second wire group G22 includes second wire 72 and second mark portion M22 (i.e., second marks 152 and 153). Second wire group G23 includes second wire 73 and second mark portion M23 (i.e., second marks 153 and 154). Second wire group G24 includes second wire 74 and second mark portion M24 (i.e., second marks 154 and 155). Second wire group G25 includes second wire 75 and second mark portion M25 (i.e., second marks 155 and 156).

In the top view of main surface 180a, second wires 71 through 75 are disposed at positions overlapping second mark portions M21 through M25, respectively. In the present embodiment, each second mark portion includes, in the top view of main surface 180a, two second marks disposed spaced apart from each other and a line segment connecting the two second marks, and second ball portion of each second wire overlaps a line segment connecting two second marks. Stated differently, in the top view of main surface 180a, each second bonding region overlaps with a line segment connecting two second marks.

By placing a second mark portion at an appropriate placement position of each second wire in the top view of main surface 180a, the plurality of second wires 71 through 75 and the plurality of second ball portions 71B through 75B can be placed at appropriate positions. By inspecting whether the second wires overlap the respective second mark portions in the top view of main surface 180a, it is possible to determine whether the position of each of the plurality of second wires 71 through 75 is acceptable or not acceptable.

In the present embodiment, the plurality of second mark portions M21 through M25 are mutually different. Accordingly, the plurality of second wires 71 through 75 are arranged in accordance with the positions of the plurality of second mark portions that are mutually different. In addition, only one second wire overlaps each of the plurality of second mark portions. This reduces the possibility of a plurality of second wires being concentrated or contacting each other.

2-3. Electrode Structure of Semiconductor Laser Element

Figure 16:
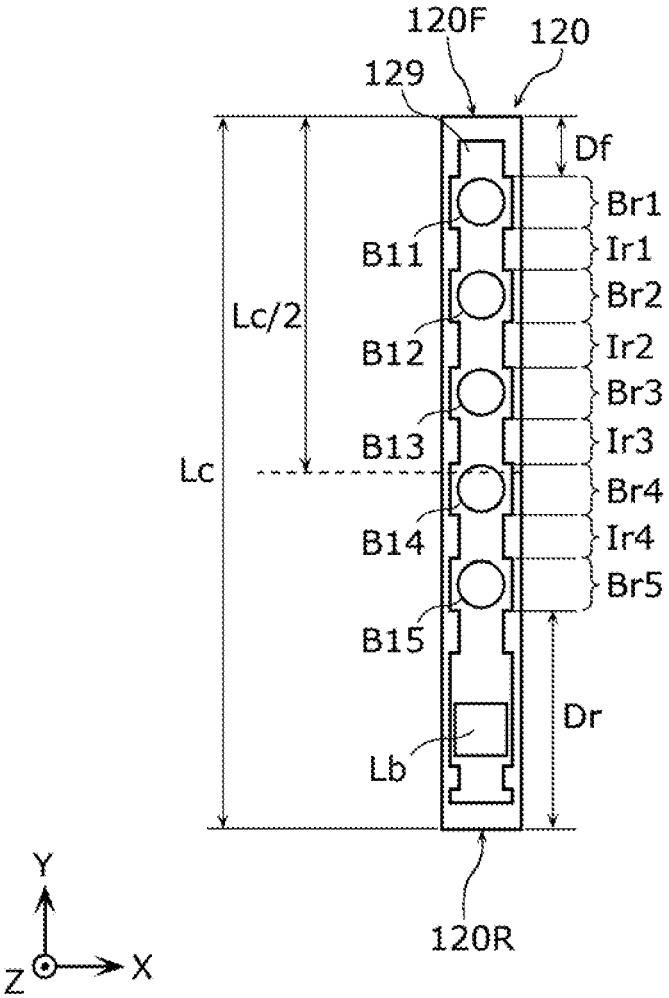
FIG. 16 is a schematic top view illustrating the structure of an electrode of the semiconductor laser element according to Embodiment 2.

Next, the structure of electrode 129 of semiconductor laser element 120 according to the present embodiment will be described with reference to FIG. 16. FIG. 16 is a schematic top view illustrating the structure of electrode 129 of semiconductor laser element 120 according to the present embodiment.

As illustrated in FIG. 16, semiconductor laser element 120 includes electrodes 129 disposed on the top surface. Electrode 129 includes a plurality of bonding portions Br1 through Br5 and one or more intermediate portions Ir1 through Ir4. Each of the one or more intermediate portions Ir1 through Ir4 is disposed between two adjacent ones of the plurality of bonding portions Br1 through Br5. More specifically, intermediate portion Ir1 is disposed between the two adjacent bonding portions Br1 and Br2, intermediate portion Ir1 is disposed between the two adjacent bonding portions Br2 and Br3, intermediate portion Ir3 is disposed between the two adjacent bonding portions Br3 and Br4, and intermediate portion Ir4 is disposed between the two adjacent bonding portions Br4 and Br5. The width in the second direction (i.e., the X-axis direction) perpendicular to the first direction of each of the plurality of bonding portions Br1 through Br5 is greater than the width in the second direction of each of the one or more intermediate portions Ir1 through Ir4.

Making the width in the second direction at each bonding portion greater than the width in the second direction at each intermediate portion facilitates bonding of the wires to the respective bonding portions. In addition, by making the widths of the bonding portions and the intermediate portions in the second direction different, each bonding portion can be easily identified, which makes it easy to determine whether or not a wire is bonded to each bonding portion.

In the present embodiment, the widths of each bonding portion and each intermediate portion in the second direction are 120 μm and 80 μm, respectively. The lengths of each bonding portion and each intermediate portion in the first direction are 90 μm and 80 μm, respectively.

In addition, distance Df from bonding portion Br1, which is the bonding portion closest to front end face 120F of semiconductor laser element 120 among the plurality of bonding portions Br1 through Br5, to front end face 120F is shorter than distance Dr from bonding portion Br5, which is the bonding portion closest to rear end face 120R of semi-conductor laser element 120 among the plurality of bonding portions Br1 through Br5, to rear end face 120R.

With this, bonding portion Br1 can be positioned close to front end face 120F, which is likely to consume the largest amount of current in semiconductor laser element 120, which means that current can be efficiently supplied to the region close to front end face 120F. In the present embodiment, distance Df is approximately 75 μm and distance Dr is approximately 355 μm.

In the present embodiment, among regions of the top surface that extends over length Lc of the resonator of semiconductor laser element 120, the number of bonding portions disposed in a region close to front end face 120F (that is, a region over distance Lc/2 from front end face 120F) is greater than the number of bonding portions disposed in a region close to rear end face 120R (that is, a region over distance Lc/2 from rear end face 120R). Stated differently, among regions of the top surface of semicon-ductor laser element 120, the surface area of the bonding portions disposed in a region close to front end face 120F is larger than the surface area of the bonding portions disposed in a region that is close to rear end face 120R. With this, more bonding portions can be disposed in the region close to front end face 120F, which is likely to consume the largest amount of current in semiconductor laser element 120, which means that current can be efficiently supplied to the region close to front end face 120F.

As illustrated in FIG. 16, in the present embodiment, electrode 129 includes, in a region between front end face 120F and bonding portion Br1, an electrode portion having a narrower width in the second direction than bonding portion Br1. In contrast, in a region between rear end face 120R and bonding portion Br5, electrode 129 includes a portion whose width in the second direction is narrower than bonding portion Br1 and a portion whose width in the second direction is equivalent to bonding portion Br5.

In the present embodiment, semiconductor laser element 120 includes chip identification mark Lb disposed in a region, of electrode 129, that is closer to rear end face 120R than to front end face 120F. Chip identification mark Lb is disposed in a region between rear end face 120R and bonding portion Br5 of electrode 129, in a portion whose width in the second direction is equivalent to bonding portion Br5.

Such a chip identification mark Lb makes it possible to identify semiconductor laser element 120. Moreover, the vicinity of rear end face 120R of semiconductor laser element 120 consumes no more current than the vicinity of front end face 120F. Therefore, placing the chip identifica-tion mark in the vicinity of rear end face 120R reduces the effect on the output of semiconductor laser element 120 more so than when chip identification mark Lb is placed in the vicinity of front end face 120F.

Chip identification mark Lb may depict characters indi-cating a model number or lot number or the like of the chip, or may depict a pattern such as a bar code. Chip identifi-cation mark Lb may be formed as a plate formed of a different material than electrode 129, or may be formed directly on electrode 129 by a method such as imprinting.

2-4. Stacked Structure of Semiconductor Laser Element

Figure 17:
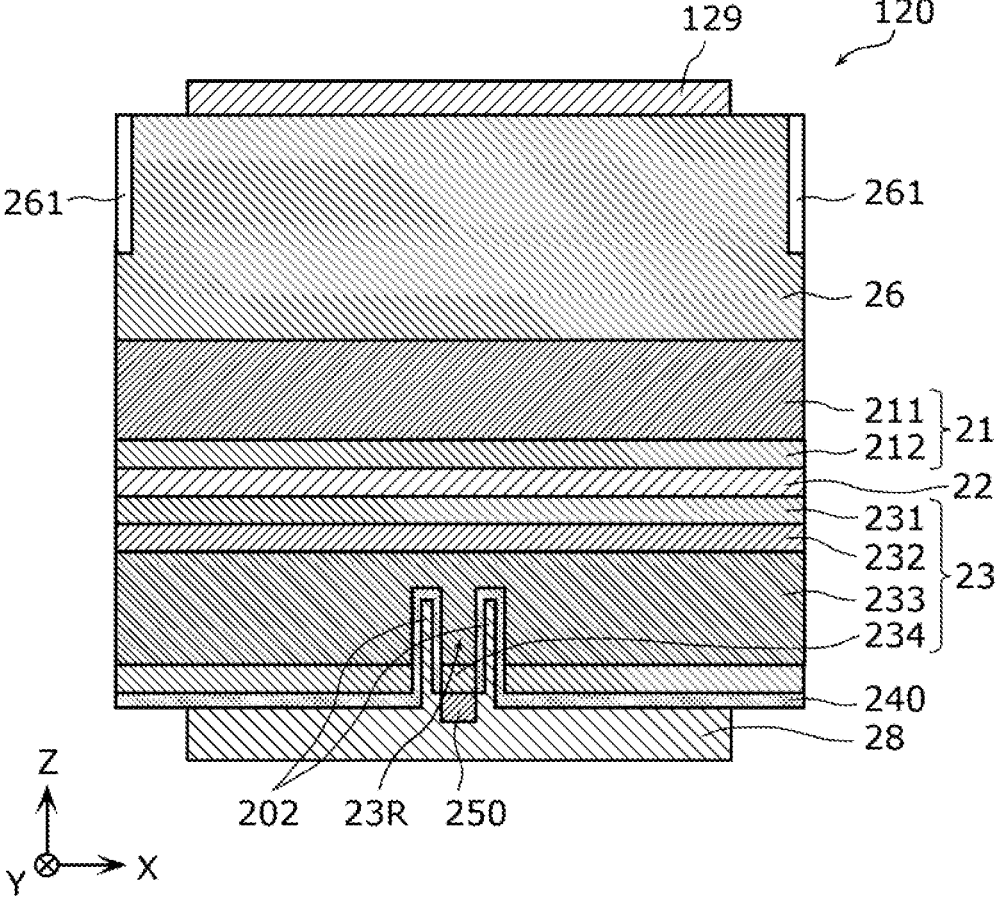
FIG. 17 is a schematic cross sectional view illustrating a configuration of the semiconductor laser element according to Embodiment 2 before being bonded to the substrate.

Next, the stacked structure of semiconductor laser ele-ment 120 according to the present embodiment will be described with reference to FIG. 17. FIG. 17 is a schematic cross section& view illustrating a configuration of semicon-ductor laser element 120 according to the present embodi-ment before being bonded to substrate 180. FIG. 17 illus-trates a cross section taken perpendicular to the first direction (i.e., the lengthwise direction of the resonator) of semiconductor laser element 120. Since semiconductor laser element 120 is junction-down mounted, substrate 26 is shown on the upper side and the semiconductor stacked body is shown on the lower side.

Just like semiconductor laser element 20 according to Embodiment 1, semiconductor laser element 120 includes substrate 26, first semiconductor layer 21, active layer 22, second semiconductor layer 23, current blocking layer 240, p-side ohmic electrode 250, and electrodes 129 and 28.

Semiconductor laser element 120 according to the present embodiment differs from semiconductor laser element 20 according to Embodiment 1 in regard to the configuration of electrode 129, the arrangement of ridge portion 23R, the shape of the side surfaces, and that grooves 263 and 264 are not formed. Hereinafter, only the differences between semiconductor laser element 120 and semiconductor laser element 20 according to Embodiment 1 will be described.

The structure of electrode 129 is as described above. Electrode 129 comprises, for example, Au.

In Embodiment 1, ridge portion 23R is offset from the widthwise the X-axis direction) center, but in the present embodiment, ridge portion 23R is disposed in the widthwise center.

In the present embodiment, groove 261 is formed in a side surface portion of the X-axis direction end portion of semiconductor laser element 120. Groove 261 is a groove for element separation that is used when semiconductor laser element 120 is diced. Groove 261 is formed extending in the thickness direction of substrate 26 from the main surface of substrate 26 on which the semiconductor stacked body is not formed.

Figure 18:
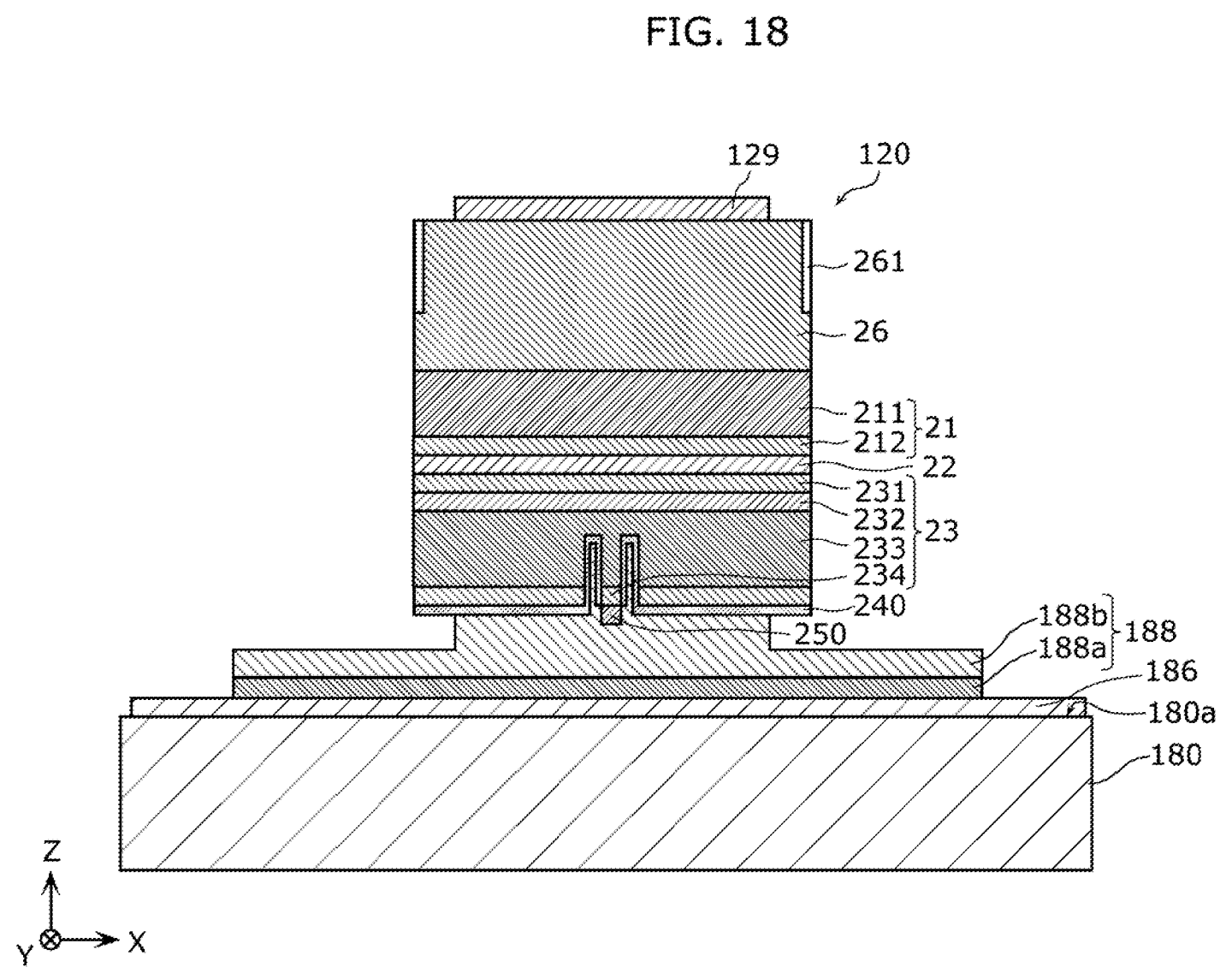

Next, the configuration of semiconductor laser element 120 according to the present embodiment after being bonded to substrate 180 will be described with reference to FIG. 18. FIG. 18 is a schematic cross sectional view illustrating a configuration of semiconductor laser element 120 according to the present embodiment after being bonded to substrate 180. FIG. 18 illustrates a cross section taken perpendicular to the first direction (i.e., the lengthwise direction of the resonator) of semiconductor laser element 120.

As illustrated in FIG. 18, metal film 186 is formed on main surface 180a of substrate 180. Semiconductor laser element 120 is bonded to metal film 186 on main surface 180a of substrate 180 by bonding member 188. In the present embodiment, bonding member 188 includes Pt film 188a and solder film 188b. When bonding semiconductor laser element 120 to main surface 180a via bonding member 188, electrode 28 comprising Au and the solder film comprising AuSn that are included in semiconductor laser element 120 are heated and melted. When these layers are cooled and solidify, they are united to form solder film 188b, which is a eutectic alloy.

2-5. Semiconductor Laser Device Manufacturing Method

Next, the manufacturing method of the semiconductor laser device 110 according to the present embodiment will be described with reference to FIG. 19 through FIG. 23. FIG. 19 through FIG. 23 are schematic front views illustrating processes of the manufacturing method of semiconductor laser device 110 according to the present embodiment.

Figure 19:
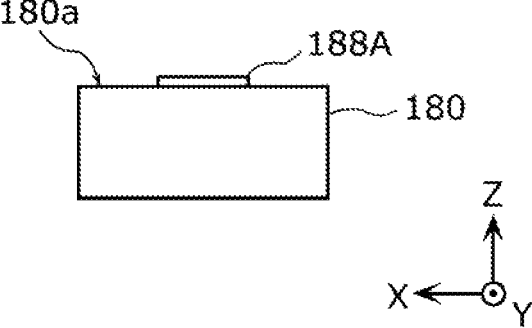
FIG. 19 is a schematic front view illustrating a first process of a manufacturing method of the semiconductor laser device according to Embodiment 2.

First, as illustrated in FIG. 19, substrate 180 including bonding member 188A disposed on main surface 180a is prepared. Before semiconductor laser element 120 is bonded, bonding member 188A includes two layers of a Pt film and a solder film comprising AuSn, which are stacked in order from the main surface 180a side.

Figure 20:
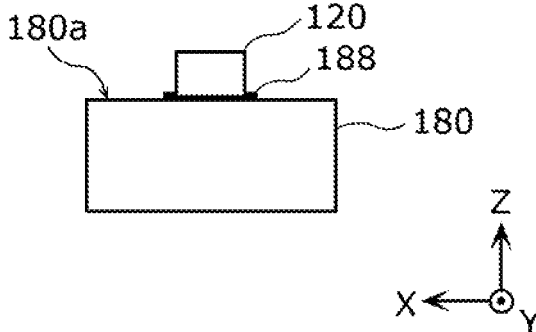
FIG. 20 is a schematic front view illustrating a second process of the manufacturing method of the semiconductor laser device according to Embodiment 2.

Then, as illustrated in FIG. 20, semiconductor laser element 120 is bonded to main surface 180a of substrate 180 using bonding member 188. More specifically, semiconductor laser element 120 is placed on main surface 180a so that, in the top view of main surface 180a, a straight line passing through and parallel to rear end face 120R of semiconductor laser element 120 overlaps fourth marks 133 and 134 (see FIG. 14), Thereafter, electrode 28 comprising Au of semiconductor laser element 120 and the solder film comprising AuSn of bonding member 188A are melted by heating semiconductor laser element 120 and substrate 180 and subsequently cooled to produce solder film 188b, which is a eutectic alloy of bonding member 188 (see FIG. 18), and bond substrate 180 and semiconductor laser element 120. Semiconductor laser element 120 is thus bonded to main surface 180a.

Figure 21:
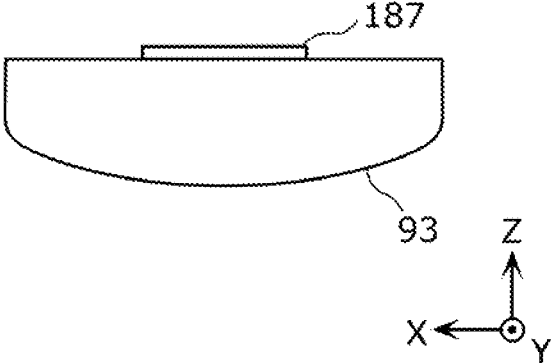
FIG. 21 is a schematic front view illustrating a third process of the manufacturing method of the semiconductor laser device according to Embodiment 2.

Next, as illustrated in FIG. 21, stem 93 is prepared and bonding member 187 is placed on the top surface of stem 93. Although not illustrated, stem 93 is erected on base 94. Lead pins 91, 92 and 95 are also erected on base 94.

Figure 22:
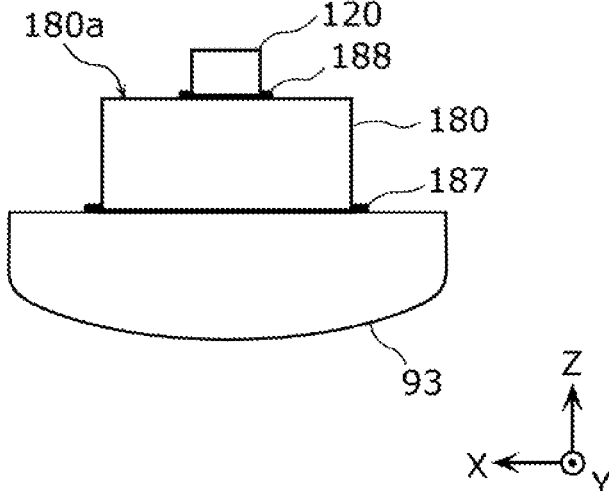
FIG. 22 is a schematic front view illustrating a fourth process of the manufacturing method of the semiconductor laser device according to Embodiment 2.

Next, as illustrated in FIG. 22, substrate 180 is bonded to the top surface of stem 93 using bonding member 187.

Figure 23:
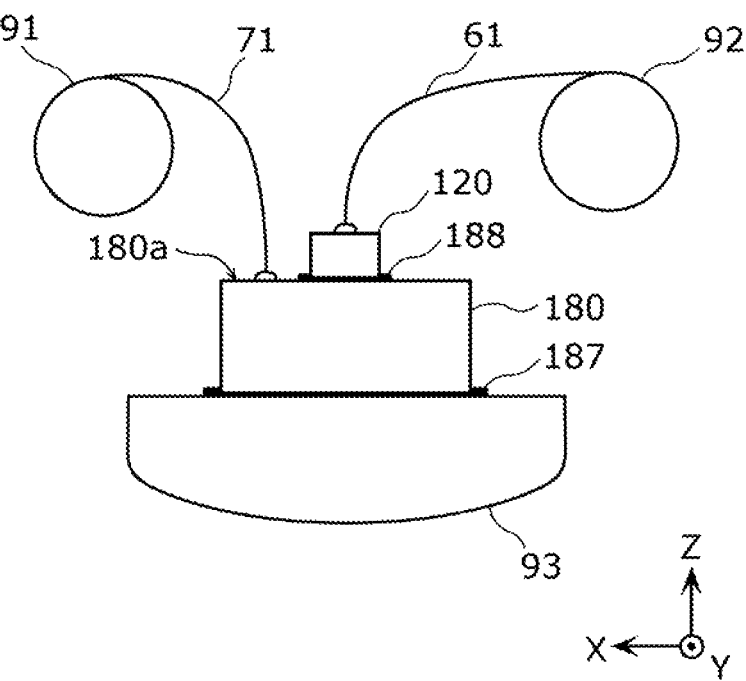
FIG. 23 is a schematic front view illustrating a fifth process of the manufacturing method of the semiconductor laser device according to Embodiment 2.

Next, as illustrated in FIG. 23, lead pin 92 and semiconductor laser element 120 are connected by first wire 61, Although not illustrated in FIG. 23, lead pin 92 and semiconductor laser element 120 are also connected by first wires 62 through 65. More specifically, first wires 61 through 65 are connected to lead pin 92 and first bonding regions B11 through B15 of semiconductor laser element 120, respectively (see FIG. 14). Lead pin 91 and main surface 180a of substrate 180 are connected by second wire 71. Although not illustrated in FIG. 23, lead pin 91 and main surface 180a are also connected by second wires 72 through 75. More specifically, second wires 71 through 75 are connected to lead pin 91 and second bonding regions B21 through B25 of main surface 180a, respectively (see FIG. 14). Here, when connecting the wires to the bonding regions, the connection position of each wire may be adjusted with reference to its corresponding mark. For example, as illustrated in FIG. 14, in the top view of main surface 180a of substrate 180, first wires 61 through 65 connected to first bonding regions B11 through B15 connect to lead pin 92 through positions overlapping first mark portions M11 through M15, specifically, directly above the separated regions connecting first marks 141 and 142, first marks 142 and 143, first marks 143 and 144, first marks 144 and 145, and first marks 145 and 146. Second wires 71 through 75 connect to substrate 180 by respectively connecting to second mark portions M21 through M25, specifically, to second bonding regions B21 through B25 disposed in separated regions connecting second marks 151 and 152, second marks 152 and 153, second marks 153 and 154, second marks 154 and 155, and second marks 155 and 156, and the other ends of second wires 71 through 75 are connected to lead pin 91.

Semiconductor laser device 110 is manufactured as described above.

Just like semiconductor laser device 10 according to Embodiment 1, semiconductor laser device 110 may be provided with a cap.

2-6. Semiconductor Laser Device Inspection Method

The manufactured semiconductor laser device 110 is inspected to see whether a straight line passing through and parallel to rear end face 120R of semiconductor laser element 120 overlaps fourth marks 133 and 134 in the top view of main surface 180a, and inspection passes when the straight line overlaps the fourth marks.

The manufactured semiconductor laser device 110 is inspected to see whether the first wires are disposed overlapping the respective first mark portions in the top view of main surface 180a, and inspection passes when all of the first wires overlap their corresponding first mark portions. Whether the second wires are bonded to substrate 180 in the respective second bonding regions disposed overlapping the respective second mark portions in the top view of main surface 180a is also inspected, and inspection passes when all of the second wires are bonded to substrate 180 in their corresponding second bonding regions disposed overlapping the respective second mark portions.

Embodiment 3

Next, the semiconductor laser device according to Embodiment 3 will be described. The semiconductor laser device according to the present embodiment differs from semiconductor laser device 110 according to Embodiment 2 mainly in regard to the configuration of the second wire group and the arrangement of semiconductor laser element 120. Hereinafter, the semiconductor laser device according to the present embodiment will be described focusing on the differences from semiconductor laser device 110 of Embodiment 2.

3-1. Overall Configuration

Figure 24:
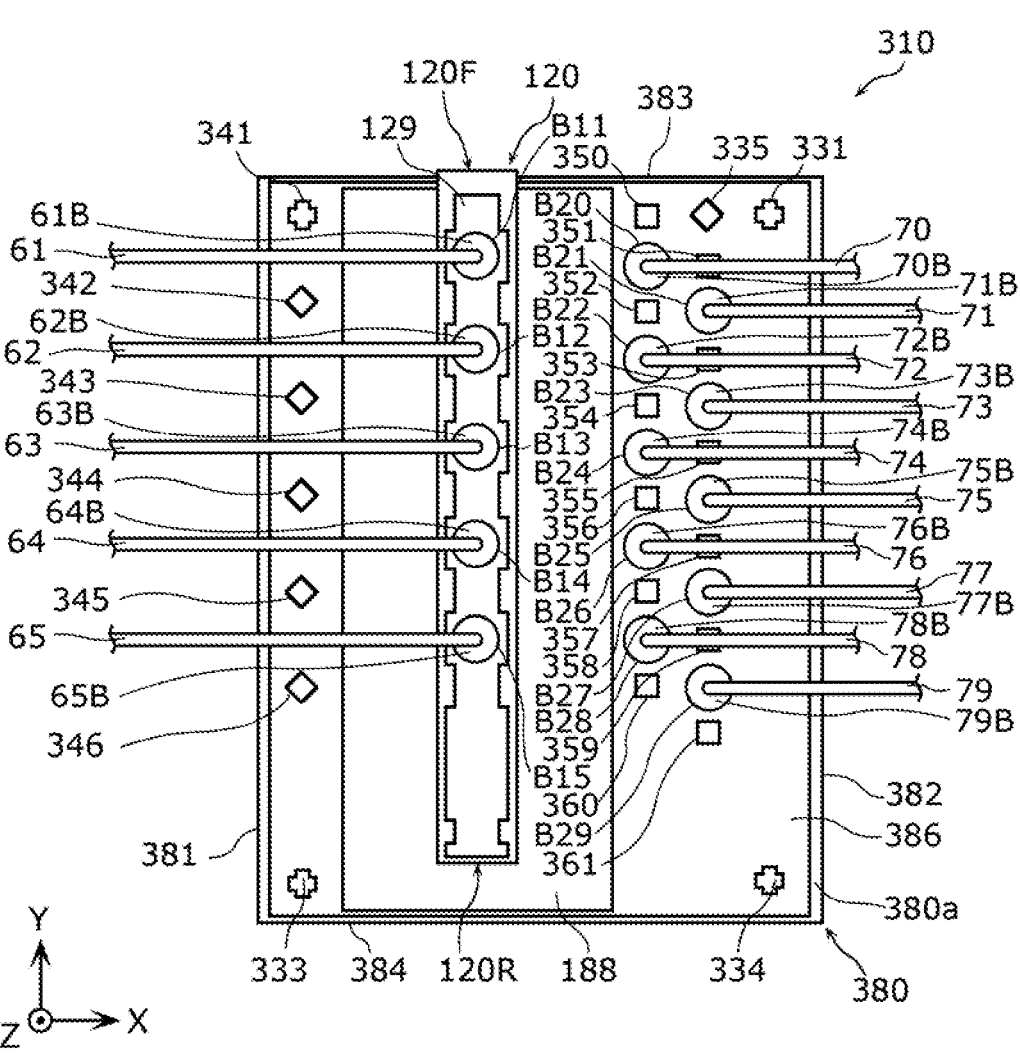
FIG. 24 is a schematic top view illustrating a configuration of a semiconductor laser device according to Embodiment 3.
Figure 25:
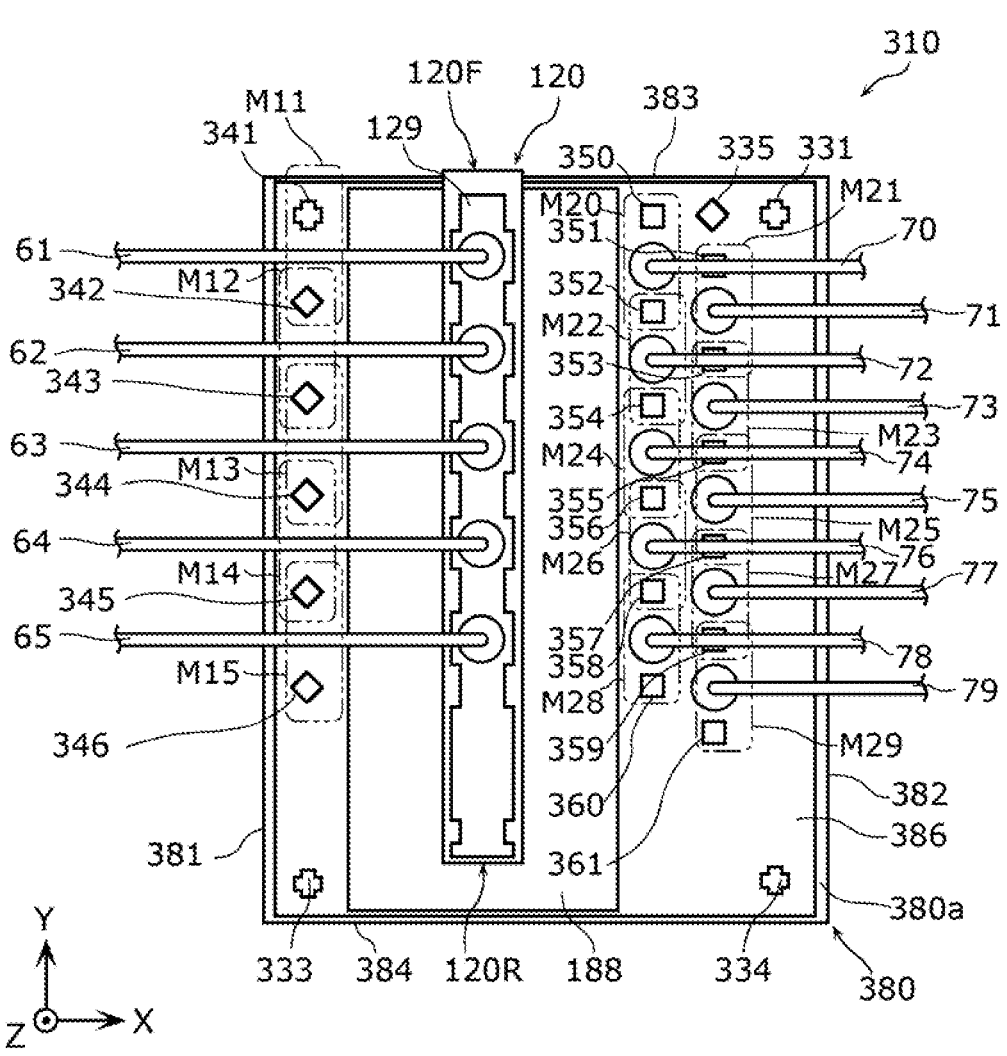
FIG. 25 is a schematic top view illustrating configurations of a plurality of first mark portions and a plurality of second mark portions of the semiconductor laser device according to Embodiment 3.

First, the overall configuration of the semiconductor laser device according to the present embodiment will be described with reference to FIG. 24 and FIG. 25. FIG. 24 is a schematic top view illustrating a configuration of semiconductor laser device 310 according to the present embodiment. FIG. 25 is a schematic top view illustrating a plurality of first mark portions M11 through M15 and a plurality of second mark portions M20 through M29 of semiconductor laser device 310 according to the present embodiment.

As illustrated in FIG. 24 and FIG. 25, semiconductor laser device 310 according to the present embodiment includes substrate 380, semiconductor laser element 120, bonding member 188, first wires 61 through 65, and second wires 70 through 79.

Semiconductor laser device 310 may further include lead pins 91, 92, and 95, stem 93, and base 94, just like in semiconductor laser device 110 according to Embodiment 2.

Substrate 380 is a submount on which semiconductor laser element 120 is provided. As illustrated in FIG. 24, substrate 380 includes main surface 380a on which metal film 386 is formed. Substrate 380 according to the present embodiment differs from substrate 180 according to Embodiment 2 in regard to the configuration of metal film 386, and is the same in regard to other configurations.

The shape of main surface 380a is a rectangle including first side 381 extending along the first direction, second side 382 disposed on the opposite side of first side 381 across semiconductor laser element 120 and extending along the first direction, and third side 383 and fourth side 384 perpendicular to first side 381 and second side 382. Main surface 380a includes second bonding regions B20 through B29 to which second wires 70 through 79 are respectively bonded. Each second bonding region is disposed between semiconductor laser element 120 and second side 382 of main surface 380a. More specifically, each second bonding region is disposed between bonding member 188 and second side 382 of main surface 380a. Bonding member 188 is a member that bonds main surface 380a of substrate 380 and semiconductor laser element 120. In the present embodiment, bonding member 188 bonds metal film 386 formed on main surface 380a and semiconductor laser element 120.

Bonding member 188 has a rectangular shape extending in the first direction in the top view of main surface 380a. Bonding member 188 is formed, for example, of the same material as bonding member 188 according to Embodiment 2.

In the present embodiment, the distance from each second bonding region to bonding member 188 is shorter than the distance from each second bonding region to second side 382. This allows each second bonding region to be brought closer to semiconductor laser element 120, which is a heat source, so heat can be efficiently dissipated via each second wire. Bringing each second bonding region closer to semiconductor laser element 120 also reduces the resistance component between each second bonding region and semiconductor laser element 120. Accordingly, the power conversion efficiency of semiconductor laser device 310 can be increased.

In the present embodiment, second bonding regions B20 through B29 are arranged in a staggered arrangement along the first direction. More specifically, second bonding regions B20, B22, B24, B26, and B28 are aligned spaced at equal intervals and parallel to the first direction in the listed order. Second bonding regions B21, B23, B25, B27, and B29 are aligned spaced at equal intervals and parallel to the first direction in the listed order and are disposed between second bonding regions B20, B22, B24, B26, and B28 on one side and second side B82 of main surface 380a on the other side. The positions of second bonding regions B20 through B29 in the first direction are mutually different. The position of second bonding region B21 in the first direction is between the position of second bonding region B20 in the first direction and the position of second bonding region B22 in the first direction. The position of second bonding region B23 in the first direction is between the position of second bonding region B22 in the first direction and the position of second bonding region B24 in the first direction. The position of second bonding region B25 in the first direction is between the position of second bonding region B24 in the first direction and the position of second bonding region B26 in the first direction. The position of second bonding region B27 in the first direction is between the position of second bonding region B26 in the first direction and the position of second bonding region B28 in the first direction. Second bonding region B29 is disposed between second bonding region B28 and fourth side B84 of main surface 380a.

By arranging second bonding regions B20 through B29 in this manner, more second bonding regions can be provided on main surface 380a while inhibiting each second bonding region (i.e., each second wire) from interfering with each other. Accordingly, more heat can be dissipated from substrate B80 through the second bonding regions and the second wires, thereby increasing the heat dissipation efficiency of semiconductor laser device 310. In the present embodiment, for example, the number and surface area of the second bonding regions can be doubled compared to when second bonding regions B21 through B25 are aligned in a single row, as they are in semiconductor laser device 110 according to Embodiment 2. Accordingly, the heat dissipation efficiency of semiconductor laser device 310 can be increased to approximately twice the heat dissipation efficiency of semiconductor laser device 110 according to Embodiment 2.

Second bonding regions B20, B22, B24, B26, and B28 are spaced at 0.15 mm intervals. Second bonding regions B21, B23, B25, B27, and B29 are spaced at 0.15 mm intervals. The distances from third side 383 of main surface 380a to the respective centers of second bonding regions 320 and 321 are 0.13 mm and 0.205 mm (=0.13+0.15/2), respectively, and the distances from fourth side 384 of main surface 380a to the respective centers of second bonding regions B28 and B29 are 0.57 mm and 0.495 mm. The distance from second side 382 of main surface 380a to the respective centers of second bonding regions B20, B22, B24, B26, and B28 is 0.30 mm, and the distance from second side B82 to the respective centers of second bonding regions B21, B23, B25, B27, and B29 is 0.18 mm.

Metal film 386 is an electrically conductive film that is connected to one electrode of semiconductor laser element 120. Metal film 386 is not particularly limited as long as it is an electrically conductive film. In the present embodiment, metal film 386 includes, in order from main surface 380a of substrate 380, a 0.1 μm thick Ti film, a 0.2 μm thick Pt film, and a 0.5 μm thick Au film. Metal film 386 is not formed in a 0.02 mm wide region at the edge of main surface 380a.

First marks 341 through 346, second marks 350 through 361, and fifth marks 331, 333, 334, and 335 are formed in metal film 386. Each mark is configured to be visible on main surface 380a.

Each first mark 341 through 346 is disposed between semiconductor laser element 120 and first side 381 of main surface 380a. More specifically, each first mark is disposed between the edge of metal film 386 on the first side 381 side and bonding member 188. First marks 341 through 346 are aligned spaced at equal intervals and parallel to the first direction. In the present embodiment, first marks 341 through 346 are spaced at 0.17 mm intervals. First mark 341 has the shape of a cross, and each of first marks 342 through 346 has a square shape. Each side of the square shaped first marks 342 through 346 is inclined at 45 degrees relative to each side of main surface 380a.

Each second mark is disposed between semiconductor laser element 120 and second side 382 of main surface 380a. More specifically, each second mark is disposed between the edge of metal film 386 on the second side 382 side and bonding member 188. Second marks 350 through 361 are arranged in a staggered arrangement along the first direction. More specifically, second marks 350, 352, 354, 356, 358, and 360 are aligned spaced at equal intervals and parallel to the first direction in the listed order. Second marks 351, 353, 355, 357, 359, and 361 are aligned spaced at equal intervals and parallel to the first direction in the listed order and are disposed between second marks 350, 352, 354, 356, 358, and 360 on one side and second side 382 on the other side. The positions of second marks 350 through 361 in the first direction are mutually different. For example, the position of second mark 351 in the first direction is between the position of second mark 350 in the first direction and the position of second mark 352 in the first direction. Second marks 350, 352, 354, 356, 358, and 360 are spaced at 0.15 mm intervals. Second marks 351, 353, 355, 357, 359, and 361 are arranged at 0.15 mm intervals. The distance from each second mark to bonding member 188 is shorter than the distance from each second mark to the second side.

In the present embodiment, second bonding region B20 is disposed between second marks 350 and 352. Similarly, second bonding region B21 is disposed between second marks 351 and 353, second bonding region B22 is disposed between second marks 352 and 354, second bonding region B23 is disposed between second marks 353 and 355, second bonding region B24 is disposed between second marks 354 and 356, second bonding region B25 is disposed between second marks 355 and 357, second bonding region B26 is disposed between second marks 356 and 358, second bonding region B27 is disposed between second marks 357 and 359, second bonding region B28 is disposed between second marks 358 and 360, and second bonding region B29 is disposed between second marks 359 and 361.

In the present embodiment, second marks 350 through 361 have a square shape. Each side of the square shaped second marks 350 through 361 is parallel or perpendicular to each side of main surface 380a.

Fifth marks 331, 333, and 334 are marks for indicating the positions of vertices of main surface 380a. Fifth marks 331, 333, and 334 are arranged in the vicinity of vertices of main surface 380a. Fifth mark 331 is disposed in the vicinity of the vertex corresponding to the intersection of second side 382 and third side 383 of main surface 380a. Fifth mark 333 is disposed in the vicinity of the vertex corresponding to the intersection of first side 381 and fourth side 384 of main surface 380a. Fifth mark 334 is disposed in the vicinity of the vertex corresponding to the intersection of second side 382 and fourth side 384 of main surface 380a. First mark 341 may be used as a mark indicating the position of the vertex corresponding to the intersection of first side 381 and third side 383 of main surface 380a. Fifth mark 335 is a mark disposed between second mark 351 and third side 383 of main surface 380a, and indicates the positions of second marks 351, 353, 355, 357, 359, and 361 in the second direction. The position of fifth mark 335 in the second direction is equal to the positions of second marks 351, 353, 355, 357, 359 and 361 in the second direction.

In the present embodiment, each of fifth marks 331, 333, and 334 has the shape of a cross, and fifth mark 335 has a square shape. Each side of the square shaped fifth mark 335 is inclined at 45 degrees relative to each side of main surface 380a.

Just like in Embodiment 2, in the present embodiment as well, each mark is formed by removing a portion of metal film 386 from the Au film to the Ti film to expose main surface 380a from beneath metal film 386. The configuration of each mark is not particularly limited as long as it is visible.

As illustrated in FIG. 25, semiconductor laser device 310 according to the present embodiment includes a plurality of first mark portions M11 through M15 and a plurality of second mark portions M20 through M29. First mark portion M11 includes first marks 341 and 342, first mark portion M12 includes first marks 342 and 343, first mark portion M13 includes first marks 343 and 344, first mark portion M14 includes first marks 344 and 345, and first mark portion M15 includes first marks 345 and 346.

Second mark portion M20 includes second marks 350 and 352, second mark portion M21 includes second marks 351 and 353, second mark portion M22 includes second marks 352 and 354, second mark portion M23 includes second marks 353 and 355, second mark portion M24 includes second marks 354 and 356, second mark portion M25 includes second marks 355 and 357, second mark portion M26 includes second marks 356 and 358, second mark portion M27 includes second marks 357 and 359, second mark portion M28 includes second marks 358 and 360, second mark portion M29 includes second marks 359 and 361.

First mark portions M11 through M15 are mutually different. Stated differently, at least part of the one or more first marks included in each of first mark portions M11 through M15 is different. Second mark portions M20 through M29 are mutually different. Stated differently, at least part of the one or more second marks included in each of second mark portions M20 through M29 is different.

Semiconductor laser element 120 is disposed on main surface 380a of substrate 380 just like as in Embodiment 2. As illustrated in FIG. 24, in the present embodiment, the distance from semiconductor laser element 120 to first side 381 is shorter than the distance from semiconductor laser element 120 to second side 382, As a result, the surface area of the region of main surface 380a from semiconductor laser element 120 to second side 382 is larger than when the distances from semiconductor laser element 120 to first side 381 and second side 382 are equal. Accordingly, it is possible to dispose more second wires (i.e., second bonding regions) in the region of main surface 380a from semiconductor laser element 120 to second side 382. Similar to the arrangement of semiconductor laser element 120, the distance from bonding member 188 to first side 381 is shorter than the distance from bonding member 188 to second side 382. Semiconductor laser element 120 is disposed at approximately the center in the second direction of bonding member 188. Just like in Embodiment 2, first bonding regions 311 through 315 are disposed on the top surface of semiconductor laser element 120.

The plurality of first wires 61 through 65 according to the present embodiment have the same configuration as the plurality of first wires 61 through 65 according to Embodiment 2, respectively. As illustrated in FIG. 24, the plurality of first wires 61 through 65 are bonded to first bonding regions B11 through B15 of the top surface of semiconductor laser element 120, respectively.

Second wires 70 through 79 are wires for supplying current that connect to main surface 380a of substrate 380. As illustrated in FIG. 24, second wires 70 through 79 are bonded to second bonding regions B20 through B29 of main surface 380a of substrate 380, respectively. Second wires 70 through 79 respectively include, at end portions on the main surface 380a side, second ball portions 703 through 793 having a hemispherical shape. Second ball portions 703 through 793 are bonded to main surface 380a at second bonding regions B20 through B29, respectively. In the top view of main surface 380a, each second wire intersects second side 382 of main surface 380a.

The material and structure of each second wire is not particularly limited. In the present embodiment, the material and structure of each second wire is the same as the material and structure of each second wire according to Embodiment 2.

In the present embodiment, the number of second wires can be increased compared to Embodiment 2, and thus the current flowing per second wire can be reduced. As a result, the amount of heat generated in each second wire can be reduced, whereby melting of each second wire can be inhibited and conduction of the heat generated in each second wire to substrate 380 can be inhibited. Moreover, since the increase in temperature of each second wire can be inhibited, heat dissipation from substrate 380 through each second wire can be promoted.

For example, if the diameter of each second wire is 38 μm and the length of each second wire is 2 mm, the fusing current (i.e., the minimum current at which the second wire melts) is approximately 4.86 A. In this case, the rated current of each second wire is set, for example, to 2.43 A, which is approximately half of the fusing current. In semiconductor laser device 110 according to Embodiment 2, when a wire of the above dimensions is used for each of the five second wires, the rated current supplied to semiconductor laser element 120 is 12.2 A. However, in the present embodiment, in order to supply a current of 12.2 A to semiconductor laser element 120, the current supplied to each of the ten second wires can be reduced to 1.22 A, Accordingly, in the present embodiment, when a wire of the above dimensions is used for each second wire, a current (1.22 A or lower) sufficiently lower than the fusing current is supplied to each second wire, whereby heat generation in each second wire can be reduced and melting of each second wire can be inhibited. In the present embodiment, it is also possible to supply a maximum current of 24.3 A to semiconductor laser element 120 by supplying a rated current of 2.43 A to each second wire.

The dimensions of each second wire are not limited to the above dimensions. The dimensions of each second wire may be any dimensions as long as they are sufficient to be applicable to semiconductor laser device 310; for example, each second wire may have a diameter of 25 μm and a length of 1.72 mm. In this case, since the fusing current of each second wire is approximately 2.43 A, the rated current is approximately 1.22 A.

3-2. Configuration of First Wire Group and Second Wire Group

Figure 26:
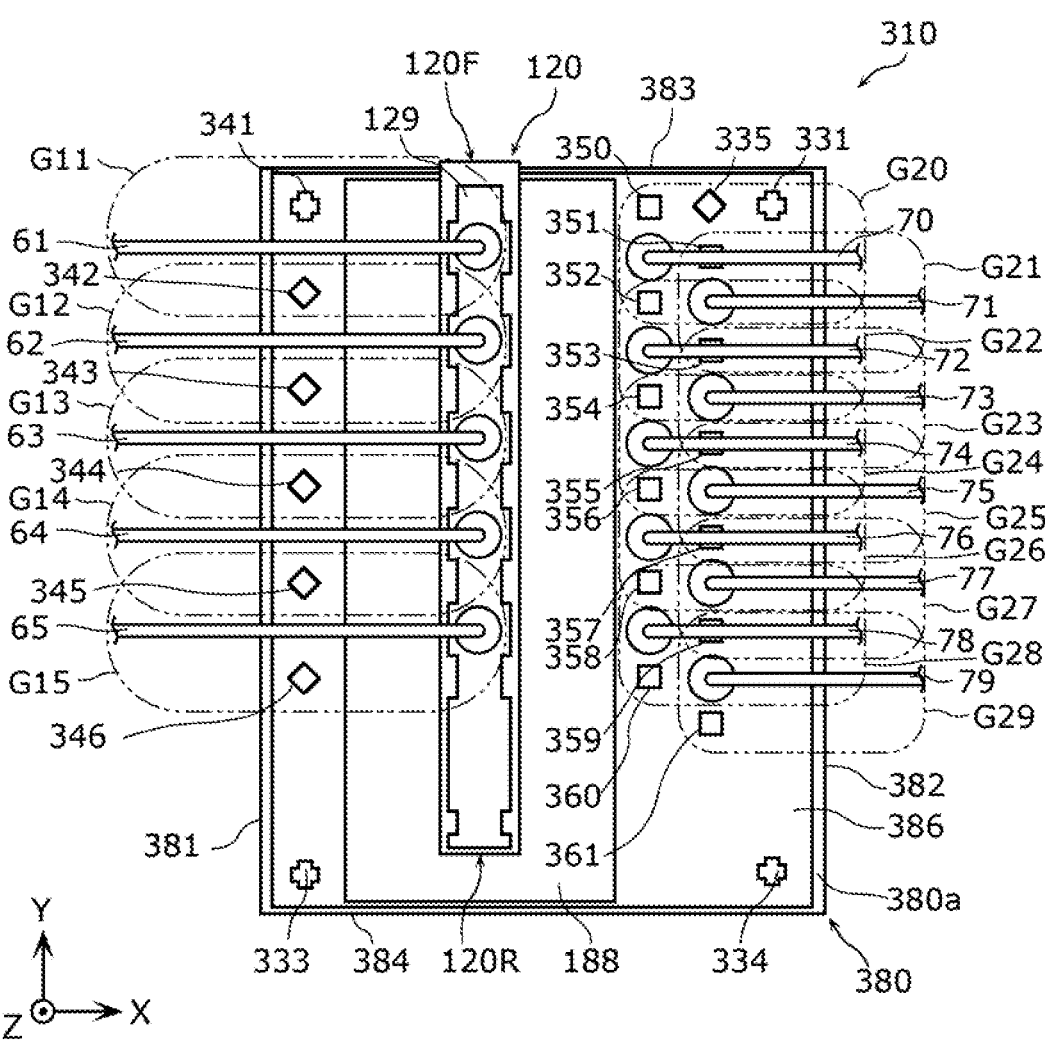
FIG. 26 is a schematic top view illustrating configurations of a plurality of first wire groups and a plurality of second wire groups according to Embodiment 3.

Next, the first wire group and the second wire group according to the present embodiment will be described with reference to FIG. 26. FIG. 26 is a schematic top view illustrating configurations of a plurality of first wire groups G11 through G15 and a plurality of second wire groups G20 through G29 according to the present embodiment.

As illustrated in FIG. 26, semiconductor laser device 310 according to the present embodiment includes a plurality of first wire groups G11 through G15 and a plurality of second wire groups G20 through G29. The number of the plurality of second wire groups G20 to G29 is greater than the number of the plurality of first wire groups G11 to G15. This allows the current supplied to each second wire to be reduced.

Each first wire group includes one or more first marks. In the present embodiment, first wire group G11 includes first wire 61 and first mark portion M11 (i.e., first marks 341 and 342). First wire group G12 includes first wire 62 and first mark portion M12 (i.e., first marks 342 and 343). First wire group G13 includes first wire 63 and first mark portion M13 (i.e., first marks 343 and 344), First wire group G14 includes first wire 64 and first mark portion M14 (i.e., first marks 344 and 345). First wire group G15 includes first wire 65 and first mark portion M15 (i.e., first marks 345 and 346).

In the top view of main surface 380a of substrate 380, first wires 61 through 65 are disposed at positions overlapping first mark portions M11 through M15, respectively. In the present embodiment, each first mark portion includes, in the top view of main surface 380a, two first marks disposed spaced apart from each other and a line segment connecting the two first marks, and each first wire overlaps a line segment connecting two first marks.

By placing a first mark portion at an appropriate placement position of each first wire in the top view of main surface 380a, the plurality of first wires 61 through 65 can be placed at appropriate positions. By inspecting whether the first wires overlap the respective first mark portions in the top view of main surface 380a, it is possible to determine whether the position of each of the plurality of first wires 61 through 65 is acceptable or not acceptable.

In the present embodiment, the plurality of first mark portions M11 through M15 are mutually different. Accordingly, the plurality of first wires 61 through 65 are arranged in accordance with the positions of the plurality of first mark portions that are mutually different. In addition, only one first wire overlaps each of the plurality of first mark portions. This reduces the possibility of a plurality of first wires being concentrated or contacting each other.

Each second wire group includes one or more second marks. Second wire group G20 includes second wire 70 and second mark portion M20 (i.e., second marks 350 and 352). Second wire group G21 includes second wire 71 and second mark portion M21 (i.e., second marks 351 and 353). Second wire group G22 includes second wire 72 and second mark portion M22 (i.e., second marks 352 and 354). Second wire group G23 includes second wire 73 and second mark portion M23 (i.e., second marks 353 and 355). Second wire group G24 includes second wire 74 and second mark portion M24 (i.e., second marks 354 and 356). Second wire group G25 includes second wire 75 and second mark portion M25 (i.e., second marks 355 and 357). Second wire group G26 includes second wire 76 and second mark portion M26 (i.e., second marks 356 and 358). Second wire group G27 includes second wire 77 and second mark portion M27 (i.e., second marks 357 and 359). Second wire group G28 includes second wire 78 and second mark portion M28 (i.e., second marks 358 and 360). Second wire group G29 includes second wire 79 and second mark portion M29 (i.e., second marks 359 and 361).

In the top view of main surface 380a, second wires 70 through 79 are disposed at positions overlapping second mark portions M20 through M29, respectively. In the present embodiment, each second mark portion includes, in the top view of main surface 380a, two second marks disposed spaced apart from each other and a line segment connecting the two second marks, and second ball portion of each second wire overlaps a line segment connecting two second marks. Stated differently, in the top view of main surface 380a, each second bonding region overlaps with a line segment connecting two second marks.

By placing a second mark portion at an appropriate placement position of each second wire in the top view of main surface 380a, the plurality of second wires 70 through 79 and the plurality of second ball portions 70B through 79B can be placed at appropriate positions. By inspecting whether the second wires overlap the respective second mark portions in the top view of main surface 380a, it is possible to determine whether the position of each of the plurality of second wires 70 through 79 is acceptable or not acceptable.

In the present embodiment, the plurality of second mark portions M20 through M29 are mutually different. Accordingly, the plurality of second wires 70 through 79 are arranged in accordance with the positions of the plurality of second mark portions that are mutually different. This reduces the possibility of a plurality of second wires being concentrated or contacting each other.

Embodiment 4

Next, the semiconductor laser device according to Embodiment 4 will be described. The semiconductor laser device according to the present embodiment differs from semiconductor laser device 310 according to Embodiment 3 mainly in regard to the configuration of the first wire group and the configuration of the semiconductor laser element. Hereinafter, the semiconductor laser device according to the present embodiment will be described focusing on the differences from semiconductor laser device 310 of Embodiment 3.

4-1. Overall Configuration

Figure 27:
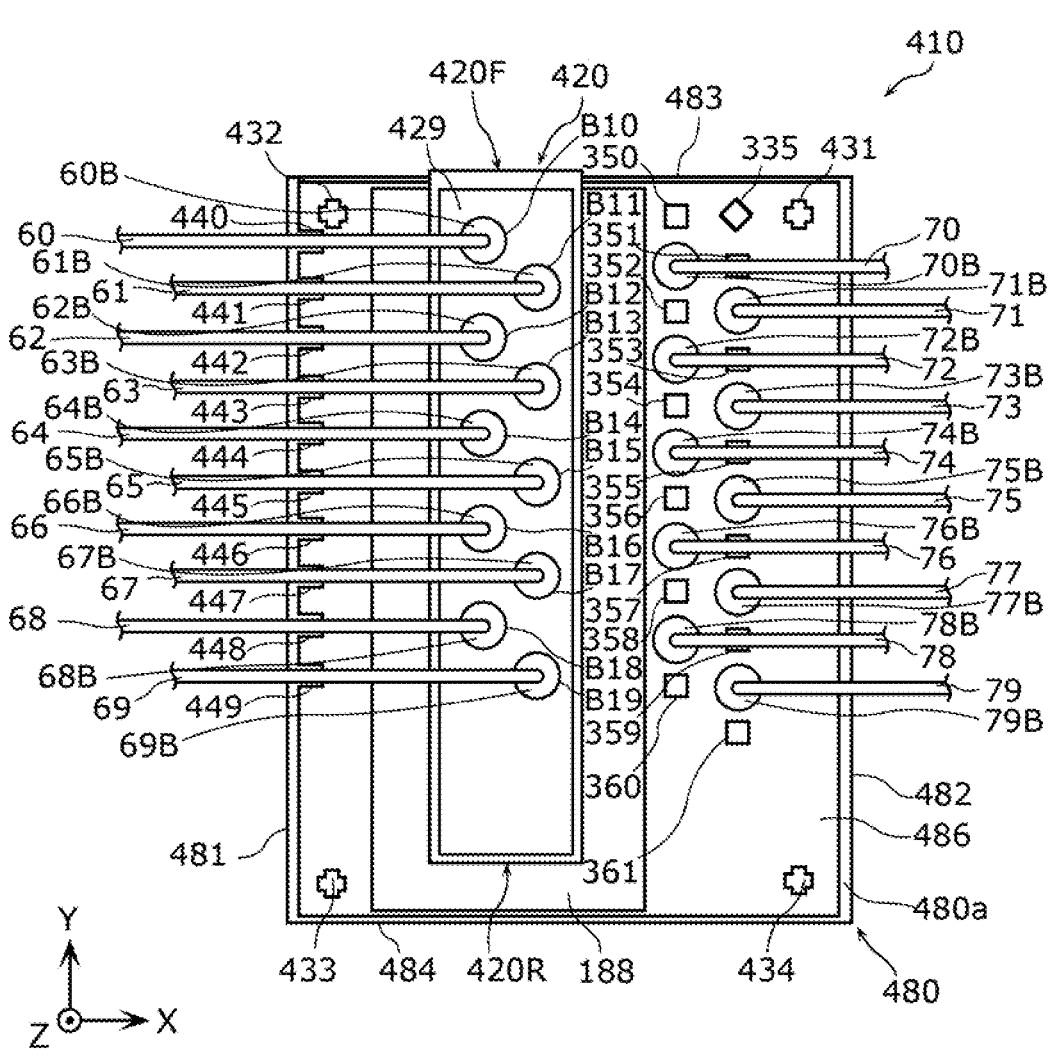
FIG. 27 is a schematic top view illustrating a configuration of a semiconductor laser device according to Embodiment 4.
Figure 28:
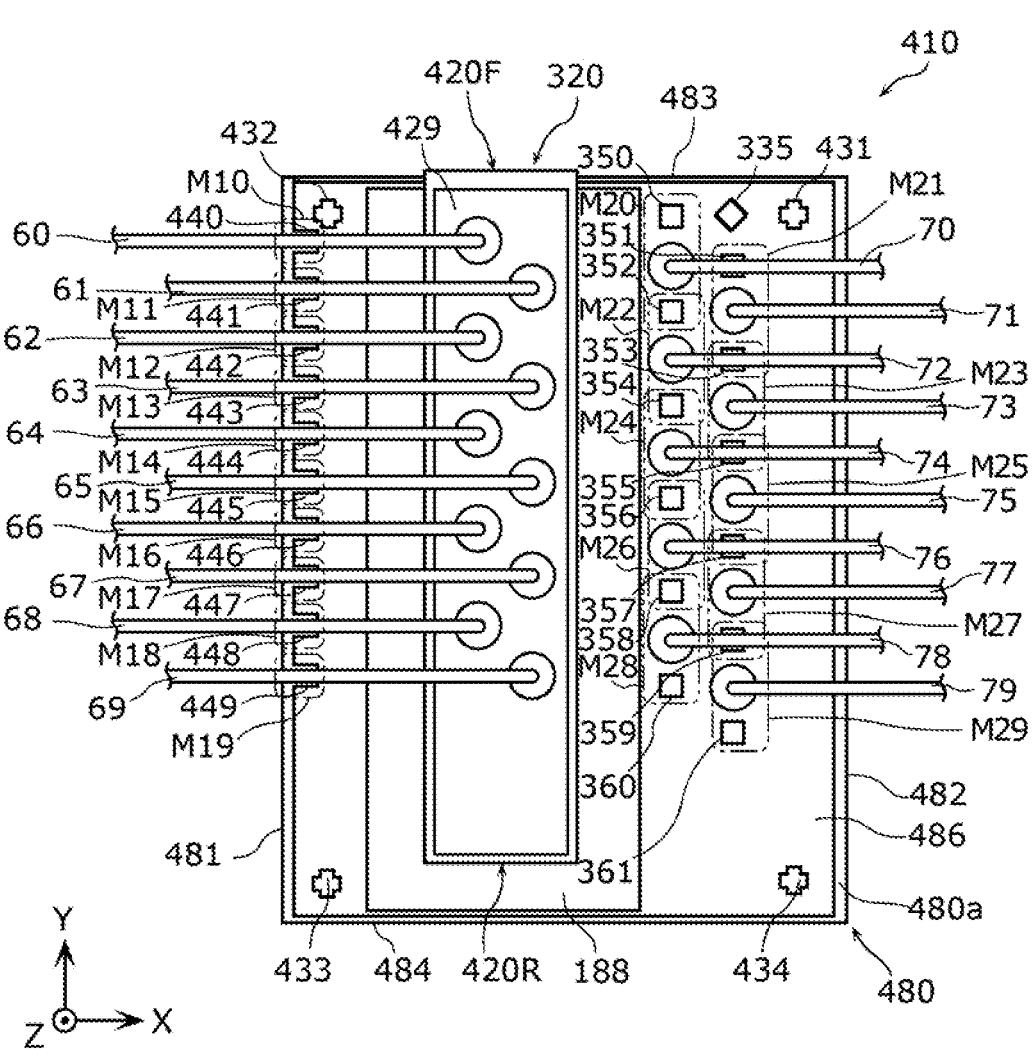
FIG. 28 is a schematic top view illustrating configurations of a plurality of first mark portions and a plurality of second mark portions of the semiconductor laser device according to Embodiment 4.

First, the overall configuration of the semiconductor laser device according to the present embodiment will be described with reference to FIG. 27 and FIG. 28. FIG. 27 is a schematic top view illustrating a configuration of semiconductor laser device 410 according to the present embodiment. FIG. 28 is a schematic top view illustrating a plurality of first mark portions M10 through M19 and a plurality of second mark portions M20 through M29 of semiconductor laser device 410 according to the present embodiment.

As illustrated in FIG. 27 and FIG. 28, semiconductor laser device 410 according to the present embodiment includes substrate 480, semiconductor laser element 420, bonding member 188, first wires 60 through 69, and second wires 70 through 79. Semiconductor laser device 410 may further include lead pins 91, 92, and 95, stem 93, and base 94, just like in semiconductor laser device 110 according to Embodiment 2.

Substrate 480 is a submount on which semiconductor laser element 420 is provided. As illustrated in FIG. 27, substrate 480 includes main surface 480a on which metal film 486 is formed. Substrate 480 according to the present embodiment differs from substrate 380 according to Embodiment 3 in regard to the configuration of metal film 486, and is the same in regard to other configurations.

The shape of main surface 480a is a rectangle including first side 481 extending along the first direction, second side 482 disposed on the opposite side of first side 481 across semiconductor laser element 420 and extending along the first direction, and third side 483 and fourth side 484 perpendicular to first side 481 and second side 482. Main surface 480a includes second bonding regions B20 through B29 to which second wires 70 through 79 are respectively bonded. Each second bonding region is disposed between semiconductor laser element 420 and second side 482 of main surface 480a. More specifically, each second bonding region is disposed between bonding member 188 and second side 482 of main surface 480a. Bonding member 188 is a member that bonds main surface 480a of substrate 480 and semiconductor laser element 420. In the present embodiment, bonding member 188 bonds metal film 486 formed on main surface 480a and semiconductor laser element 420. Bonding member 188 has a rectangular shape extending in the first direction in the top view of main surface 480a. Bonding member 188 is formed, for example, of the same material as bonding member 188 according to Embodiment 2 and Embodiment 3.

Second bonding regions B20 through B29 according to the present embodiment have the same configuration as second bonding regions B20 through B29 according to Embodiment 3.

Metal film 486 is an electrically conductive film that is connected to one electrode of semiconductor laser element 420. Metal film 486 is not particularly limited as long as it is an electrically conductive film. In the present embodiment, metal film 486 includes, in order from main surface 480a of substrate 480, a 0.1 μm thick Ti film, a 0.2 μm thick Pt film, and a 0.5 μm thick Au film. Metal film 386 is not formed in a 0.02 mm wide region at the edge of main surface 380a.

First marks 440 through 449, second marks 350 through 361, and fifth marks 431, 432, 433, 434, and 335 are formed on metal film 486. Each mark is configured to be visible on main surface 480a.

Each first mark is disposed between semiconductor laser element 420 and first side 481 of main surface 480a. The shape and dimensions of each first mark according to the present embodiment are the same as for each first mark according to Embodiment 1. Each first mark has a quadrangular shape and is in contact with the outer edge on the first side 481 side of main surface 480a of metal film 486. Stated differently, each first mark is a notch formed inwardly from the first side 481 side end portion of metal film 486.

In the top view of main surface 480*a*, first marks 440 through 449 are disposed directly below first wires 60 through 69, respectively. In the present embodiment, the distance from third side 483 of main surface 480*a* to the center of each first mark 440 in the first direction is 0.12 mm. First marks 440 through 449 are aligned spaced at equal intervals with a center-to-center distance of 0.085 mm.

Each second mark is disposed between semiconductor laser element 420 and second side 482 of main surface 480*a*. More specifically, each second mark is disposed between the edge of metal film 486 on the second side 482 side and bonding member 188. Second marks 350 through 361 are arranged in same manner as second marks 350 through 361 according to Embodiment 3.

Fifth marks 431 through 434 are marks for indicating the position of each vertex of main surface 480*a*. Fifth marks 431 through 434 are arranged in the vicinity of respective vertices of main surface 480*a*. Fifth mark 431 is disposed in the vicinity of the vertex corresponding to the intersection of second side 482 and third side 483 of main surface 480*a*. Fifth mark 432 is disposed in the vicinity of the vertex corresponding to the intersection of first side 481 and third side 483 of main surface 480*a*. Fifth mark 433 is disposed in the vicinity of the vertex corresponding to the intersection of first side 481 and fourth side 484 of main surface 480*a*. Fifth mark 434 is disposed in the vicinity of the vertex corresponding to the intersection of second side 482 and fourth side 384 of main surface 480*a*. Fifth mark 335 is a mark disposed between second mark 351 and third side 483 of main surface 480*a*, and indicates the positions of second marks 351, 353, 355, 357, 359, and 361 in the second direction. The position of fifth mark 335 in the second direction is equal to the positions of second marks 351, 353, 355, 357, 359 and 361 in the second direction.

In the present embodiment, each of fifth marks 431 through 434 has the shape of a cross, and fifth mark 335 has a square shape, Each side of the square shaped fifth mark 335 is inclined at 45 degrees relative to each side of main surface 480*a*.

Just like in Embodiment 2, in the present embodiment as well, each mark is formed by removing a portion of metal film 486 from the Au film to the Ti film to expose main surface 480*a* from beneath metal film 486. The configuration of each mark is not particularly limited as long as it is visible.

As illustrated in FIG. 28, semiconductor laser device 410 according to the present embodiment includes a plurality of first mark portions M10 through M19 and a plurality of second mark portions M20 through M29. First mark portions M10 through M19 include first marks 440 through 449, respectively.

The configuration of second mark portions M20 through M29 is the same as the configuration of second mark portions M20 through M29 according to Embodiment 3.

The first mark portions are mutually different. Stated differently, the first marks included in the first mark portions, which is one first mark per first mark portion, are mutually different. Second mark portions M20 through M29 are mutually different.

As illustrated in FIG. 27 and FIG. 28, semiconductor laser element 420 according to the present embodiment is disposed on main surface 480*a* of substrate 480 and includes a resonator extending along a first direction among in-plane directions of main surface 480*a*. In the present embodiment, the resonator of semiconductor laser element 420 is formed with front end face 420F and rear end face 420R. Front end face 420F is the end face on the end of semiconductor laser element 420 from which the laser beam is emitted, and has a lower reflectance to the laser beam than rear end face 420R. Rear end face 420R is a highly reflective end face that reflects the laser beam of semiconductor laser element 420. The first direction is the direction in which the laser beam resonates, i.e., the direction in which the laser beam is emitted, and is parallel to the Y-axis direction in each figure. Front end face 420F is disposed outside the outer edge of substrate 480 when substrate 480 is viewed from the top.

Electrode 429 is formed on the top surface of semiconductor laser element 420 (i.e., the surface opposite the surface bonded to substrate 480). In the present embodiment, electrode 429 has the shape of a rectangle in the top view of main surface 480*a* of substrate 480. The top surface of semiconductor laser element 420 includes first bonding regions 310 through 319 to which first wires 60 through 69 are respectively bonded. Semiconductor laser element 420 according to the present embodiment is junction-down mounted on main surface 480*a* of substrate 480. In other words, semiconductor laser element 420 is mounted to main surface 480*a* on the semiconductor stacked body side of semiconductor laser element 420 rather than on the substrate side.

In the present embodiment, first bonding regions B10 through B19 are arranged in a staggered arrangement along the first direction. More specifically, first bonding regions B10, B12, B14, B16, and B18 are aligned spaced at equal intervals and parallel to the first direction in the listed order. First bonding regions B11, B13, B15, B17, and B19 are aligned spaced at equal intervals and parallel to the first direction in the listed order and are disposed between first bonding regions B10, B12, B14, B16, and B18 on one side and second side 482 of main surface 480*a* on the other side. The positions of first bonding regions B10 through B19 in the first direction are mutually different. The position of first bonding region B11 in the first direction is between the position of first bonding region B10 in the first direction and the position of first bonding region B12 in the first direction. The position of first bonding region B13 in the first direction is between the position of first bonding region B12 in the first direction and the position of first bonding region B14 in the first direction. The position of first bonding region B15 in the first direction is between the position of first bonding region B14 in the first direction and the position of first bonding region B16 in the first direction. The position of first bonding region B17 in the first direction is between the position of first bonding region B16 in the first direction and the position of first bonding region B18 in the first direction. First bonding region B19 is disposed between first bonding region B18 and fourth side 484 of main surface 480*a*.

The distances from front end face 420F of semiconductor laser element 420 to the respective centers of first bonding regions B10 and B11 are 0.12 mm and 0.205 mm, respectively. First bonding regions B10, B12, B14, B16, and B18 are arranged spaced at equal intervals with a center-to-center distance of 0.17 mm, and first bonding regions B11, B13, B15, B17, and B19 are arranged spaced at equal intervals with a center-to-center distance of 0.17 mm.

By arranging first bonding regions B10 through B19 in this manner, more first bonding regions can be provided on electrode 429 of semiconductor laser element 420 while inhibiting each first bonding region (i.e., each first wire) from interfering with each other. Accordingly, more heat can be dissipated from semiconductor laser element 420 through the first bonding regions and the first wires, thereby increasing the heat dissipation efficiency of semiconductor laser device 410, In the present embodiment, for example, the number and surface area of the first bonding regions can be doubled compared to when first bonding regions B10 through B14 are aligned in a single row, as they are in semiconductor laser device 310 according to Embodiment 3. Accordingly, the heat dissipation efficiency of semiconductor laser device 410 can be increased to approximately twice the heat dissipation efficiency of semiconductor laser device 310 according to Embodiment 3.

Moreover, by arranging first bonding regions B10 through B19 in a staggered arrangement, current can be supplied more uniformly to semiconductor laser element 420 via first bonding regions B10 through B19. In other words, the distribution of the amount of current supplied to semiconductor laser element 120 with respect to the position in the first direction can be made uniform.

The size and structure of semiconductor laser element 420 are not particularly limited. In the present embodiment, the length of the resonator of semiconductor laser element 420 is 1200 μm, the width in second direction is 225 μm, and the thickness (the Z-axis direction dimension) is 85 μm. The stacked structure of semiconductor laser element 420 is the same as the stacked structure of semiconductor laser element 120 according to Embodiment 2.

As illustrated in FIG. 27 and FIG. 28, just like in Embodiment 3, the distance from semiconductor laser element 420 to first side 481 of main surface 480a of substrate 480 is shorter than the distance from semiconductor laser element 420 to second side 482 in the present embodiment as well. Accordingly, it is possible to dispose more second wires (i.e., second bonding regions) in the region of main surface 480a from semiconductor laser element 420 to second side 482. Similar to the arrangement of semiconductor laser element 420, the distance from bonding member 188 to first side 481 is shorter than the distance from bonding member 188 to second side 482. Semiconductor laser element 420 is disposed at approximately the center in the second direction of bonding member 188.

The plurality of first wires 60 through 69 according to the present embodiment have the same configuration as the plurality of first wires 61 through 65 according to Embodiment 2, respectively. As illustrated in FIG. 27, the plurality of first wires 60 through 69 are bonded to first bonding regions B10 through B19 of the top surface of semiconductor laser element 420, respectively. First wires 60 through 69 respectively include, at end portions on the semiconductor laser element 420 side, first ball portions 60B through 69B having a hemispherical shape. First ball portions 60B through 69B are bonded to semiconductor laser element 420 at first bonding regions B10 through B19, respectively. In the top view of main surface 380a, each first wire intersects first side 481 of main surface 380a.

Second wires 70 through 79 have the same configuration as second wires 70 through 79 according to Embodiment 3.

In the present embodiment, the number of first wires can be increased compared to Embodiment 3, and thus the current flowing per first wire can be reduced. As a result, the amount of heat generated in each first wire can be reduced, whereby melting of each first wire can be inhibited and conduction of the heat generated in each first wire to semiconductor laser element 420 can be inhibited. Moreover, since the increase in temperature of each first wire can be inhibited, heat dissipation from semiconductor laser element 420 through each first wire can be promoted.

For example, if the diameter of each first wire is 38 μm and the length of each second wire is 2 mm, the fusing current is approximately 4.86 A. In this case, the rated current of each first wire is set, for example, to 2.43 A, which is approximately half of the fusing current. In semiconductor laser device 310 according to Embodiment 3, when a wire of the above dimensions is used for each of the five first wires, the rated current supplied to semiconductor laser element 120 is 12.2 A. However, in the present embodiment, in order to supply a current of 12.2 A to semiconductor laser element 420, the current supplied to each of the ten first wires can be reduced to 1.22 A. Accordingly, in the present embodiment, when a wire of the above dimensions is used for each first wire, a current (1.22 A or lower) sufficiently lower than the fusing current is supplied to each first wire, whereby heat generation in each first wire can be reduced and melting of each first wire can be inhibited. In the present embodiment, it is also possible to supply a maximum current of 24.3 A to semiconductor laser element 420 by supplying a rated current of 2.43 A to each first wire.

The dimensions of each first wire are not limited to the above dimensions. The dimensions of each first wire may be any dimensions as long as they are sufficient to be applicable to semiconductor laser device 410; for example, each first wire may have a diameter of 50 μm and a length of 3.46 mm.

4-2. Configuration of First Wire Group and Second Wire Group

Figure 29:
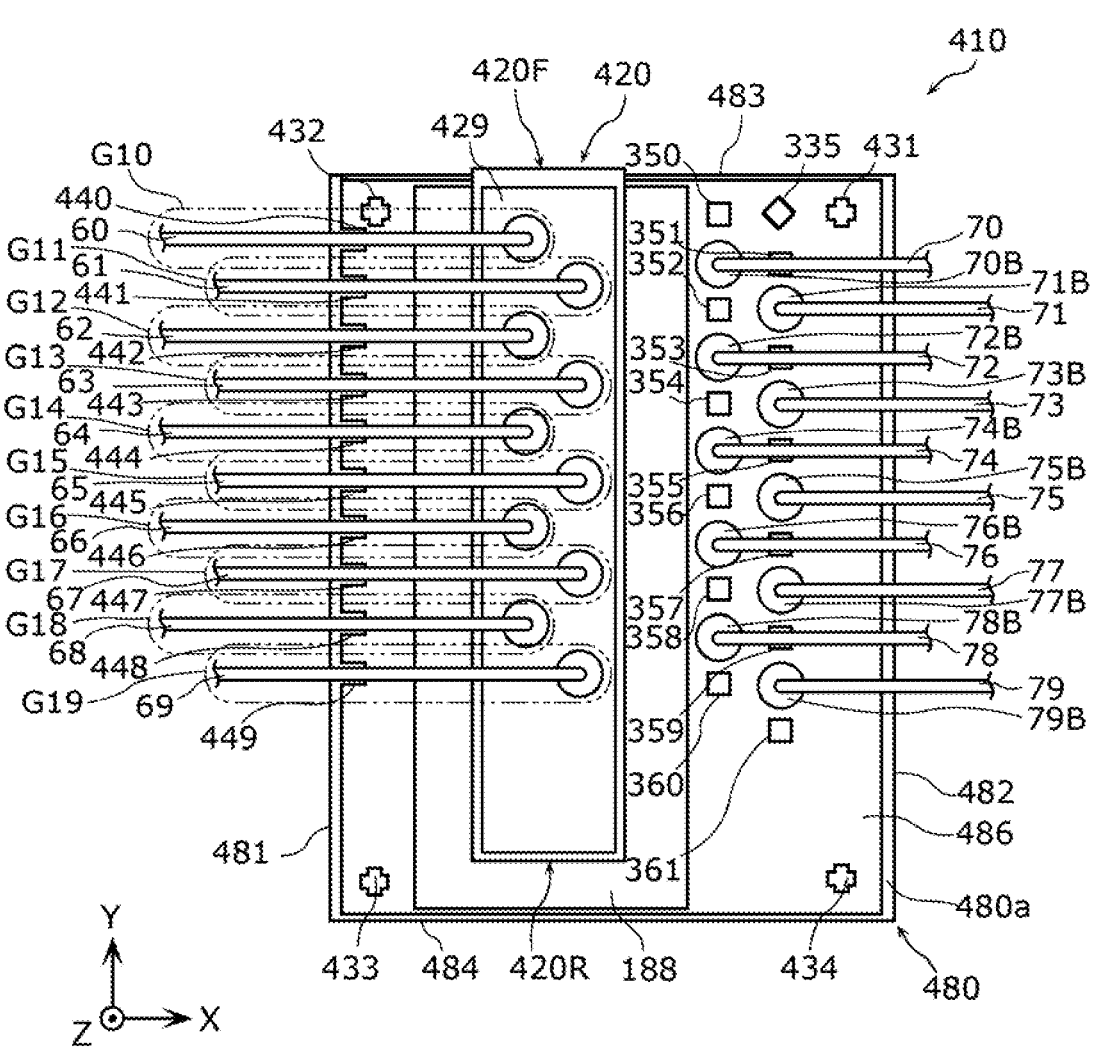
FIG. 29 is a schematic top view illustrating configurations of a plurality of first wire groups and a plurality of second wire groups according to Embodiment 4.

Next, the first wire group and the second wire group according to the present embodiment will be described with reference to FIG. 29. FIG. 29 is a schematic top view illustrating configurations of a plurality of first wire groups G10 through G19 and a plurality of second wire groups G20 through G29 according to the present embodiment.

As illustrated in FIG. 29, semiconductor laser device 410 according to the present embodiment includes a plurality of first wire groups G10 through G19 and a plurality of second wire groups G20 through G29.

Each first wire group includes one or more first marks. In the present embodiment, first wire group G10 includes first wire 60 and first mark portion M10 (i.e., first mark 440). First wire group G11 includes first wire 61 and first mark portion M11 (i.e., first mark 441), First wire group G12 includes first wire 62 and first mark portion M12 (i.e., first mark 442). First wire group G13 includes first wire 63 and first mark portion M13 (i.e., first mark 443). First wire group G14 includes first wire 64 and first mark portion M14 (i.e., first mark 444). First wire group G15 includes first wire 65 and first mark portion M15 (i.e., first mark 445). First wire group G16 includes first wire 66 and first mark portion M16 (i.e., first mark 446). First wire group G17 includes first wire 67 and first mark portion M17 (i.e., first mark 447). First wire group G18 includes first wire 68 and first mark portion M18 (i.e., first mark 448). First wire group G19 includes first wire 69 and first mark portion M19 (i.e., first mark 449).

In the top view of main surface 480a of substrate 480, first wires 60 through 69 are disposed at positions overlapping first mark portions M10 through M19, respectively. By placing a first mark portion at an appropriate placement position of each first wire in the top view of main surface 480a, the plurality of first wires 60 through 69 can be placed at appropriate positions. By inspecting whether the first wires overlap the respective first mark portions in the top view of main surface 480a, it is possible to determine whether the position of each of the plurality of first wires 60 through 69 is acceptable or not acceptable.

In the present embodiment, the plurality of first mark portions M10 through M19 are mutually different. Accordingly, the plurality of first wires 60 through 69 are arranged in accordance with the positions of the plurality of first mark portions that are mutually different. In addition, only one first wire overlaps each of the plurality of first mark portions. This reduces the possibility of a plurality of first wires being concentrated or contacting each other. Each second wire group includes one or more second marks.

Second wire groups G20 through G29 according to the present embodiment have the same configuration as second wire groups G20 through G29 according to Embodiment 3, respectively. As a result, each second wire group according to the present embodiment achieves the same advantageous effect as each wire group according to Embodiment 3.

Variations, Etc.

Although the semiconductor laser device according to the present disclosure has been described above based on embodiments, the present disclosure is not limited to the above embodiments.

For example, in each of the above embodiments, the shape of each mark is a square or the like, but the shape of each mark is not particularly limited. For example, the shape of each mark may be a polygon, a circle, an ellipse, an oblong shape, a star, or the like.

In each of the above embodiments, each mark portion includes one or two marks, but each mark portion may include three or more marks. Stated differently, a first mark portion need only include one or more first marks, and a second mark portion need only include one or more second marks.

When the mark portion includes three or more marks, the envelope enclosing all of the three or more marks and the region inside the envelope may be defined as the mark portion. For all combinations of two of the three or more marks, the mark portion may be determined as described with reference to FIG. 5, and the mark portion for all combinations added together may be defined as the mark portion containing the three or more marks.

Figure 30:
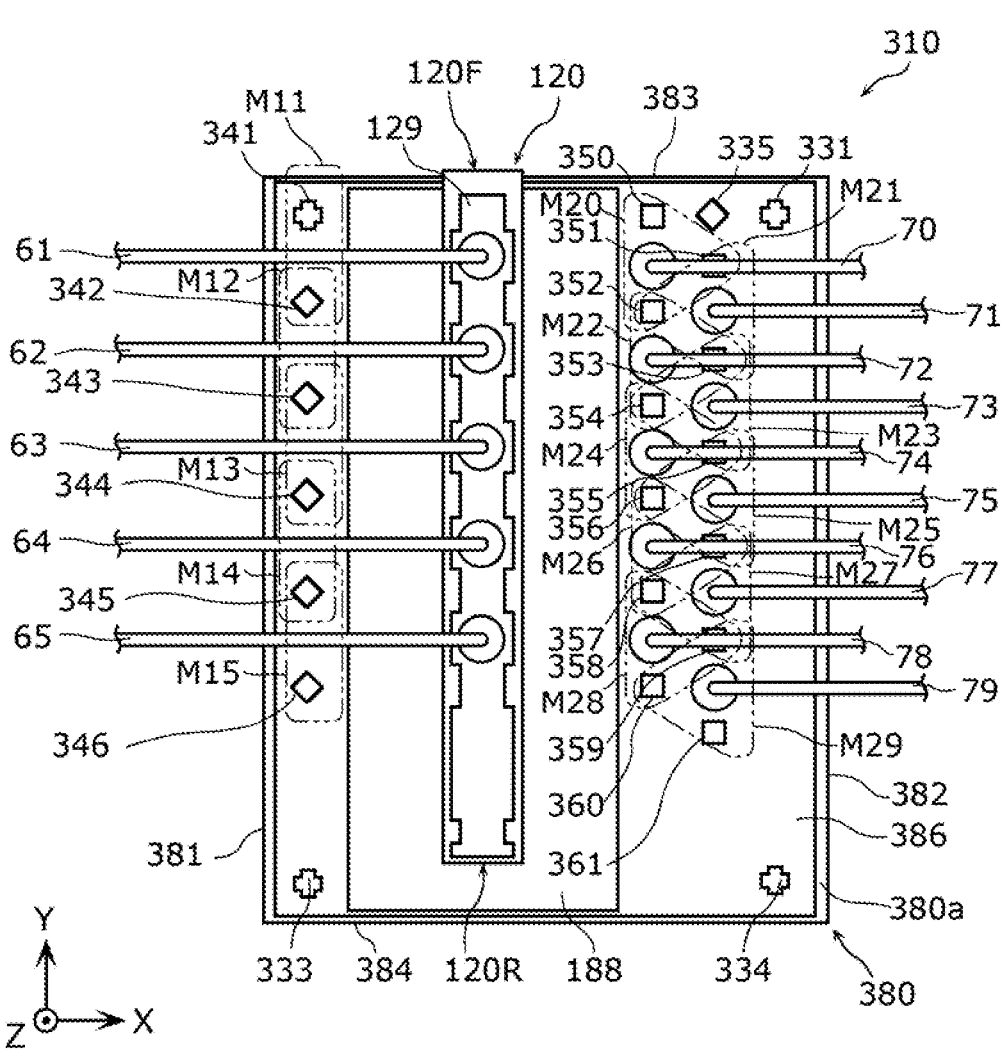
FIG. 30 is a schematic top view illustrating a variation of the plurality of second mark portions of the semiconductor laser device according to Embodiment 3.

Next, as an example in which there are three or more marks included in each mark portion, a variation of each second mark portion according to Embodiment 3 will be described with reference to FIG. 30. FIG. 30 is a schematic top view illustrating a variation of the plurality of second mark portions M20 through M29 of semiconductor laser device 310 according to Embodiment 3.

As illustrated in FIG. 30, each second mark portion includes three second marks. In other words, second mark portion M20 includes second marks 350 through 352, second mark portion M21 includes second marks 351 through 353, second mark portion M22 includes second marks 352 through 354, second mark portion M23 includes second marks 353 through 355, second mark portion M24 includes second marks 354 through 356, second mark portion M25 includes second marks 355 through 357, second mark portion M26 includes second marks 356 through 358, second mark portion M27 includes second marks 357 through 359, second mark portion M28 includes second marks 358 through 360, second mark portion M29 includes second marks 359 through 361.

Each second mark portion in semiconductor laser device 310 according to Embodiment 3 may thus include three second marks. This allows second mark 351 to be used, for example, in positioning second wire 70 in the first direction and inspecting the position of second wire 70 in the first direction. Stated differently, the position of second wire 70 in the first direction can be determined so that second wire 70 overlaps second mark 351 in the top view of main surface 380a of substrate 380. When inspecting the position of second wire 70, whether or not second wire 70 overlaps second mark 351 in the top view of main surface 380a can be used to determine whether or not the position of second wire 70 in the first direction is acceptable. The other second wires 71 through 79 can similarly be positioned in the first direction and inspected for their positions using second marks 352 through 360, respectively.

Figure 31:
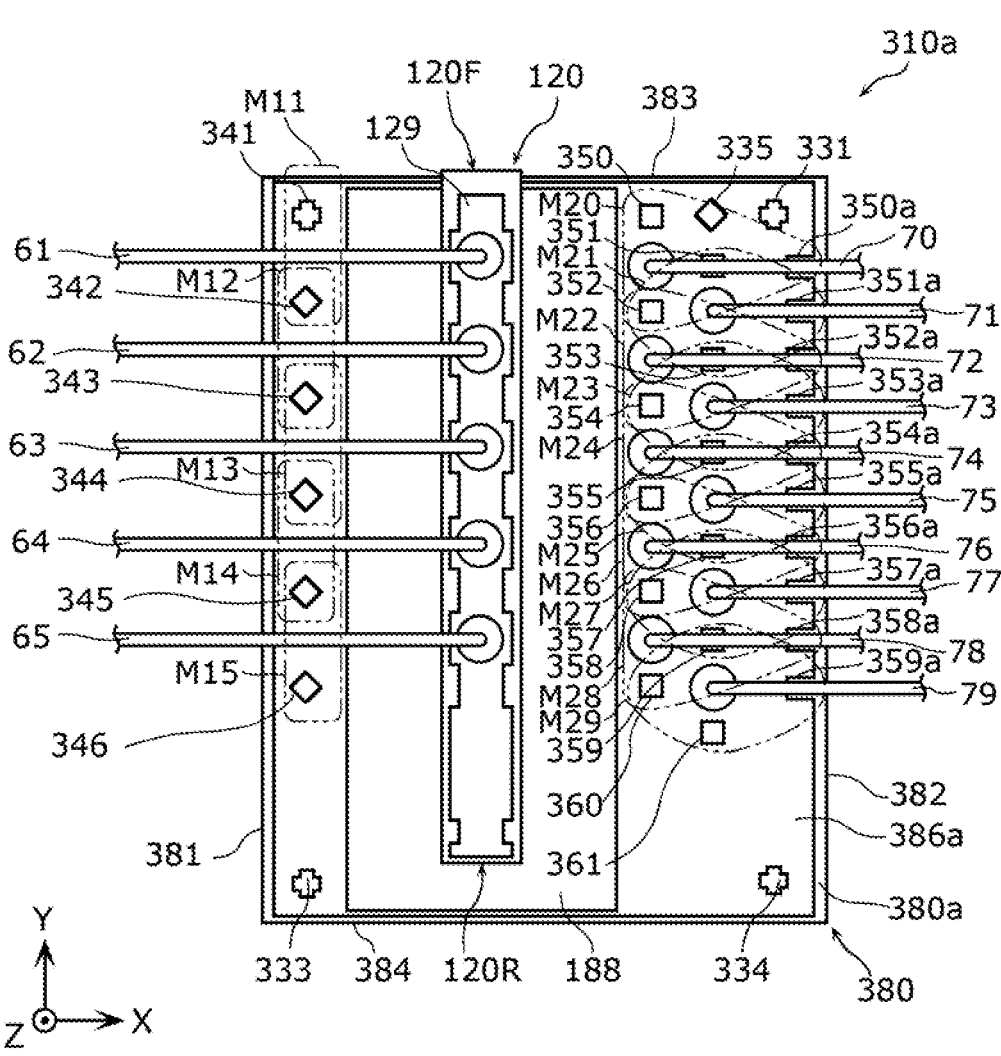
FIG. 31 is a schematic top view illustrating a plurality of second mark portions of a semiconductor laser device according to a variation of Embodiment 3.
Figure 32:
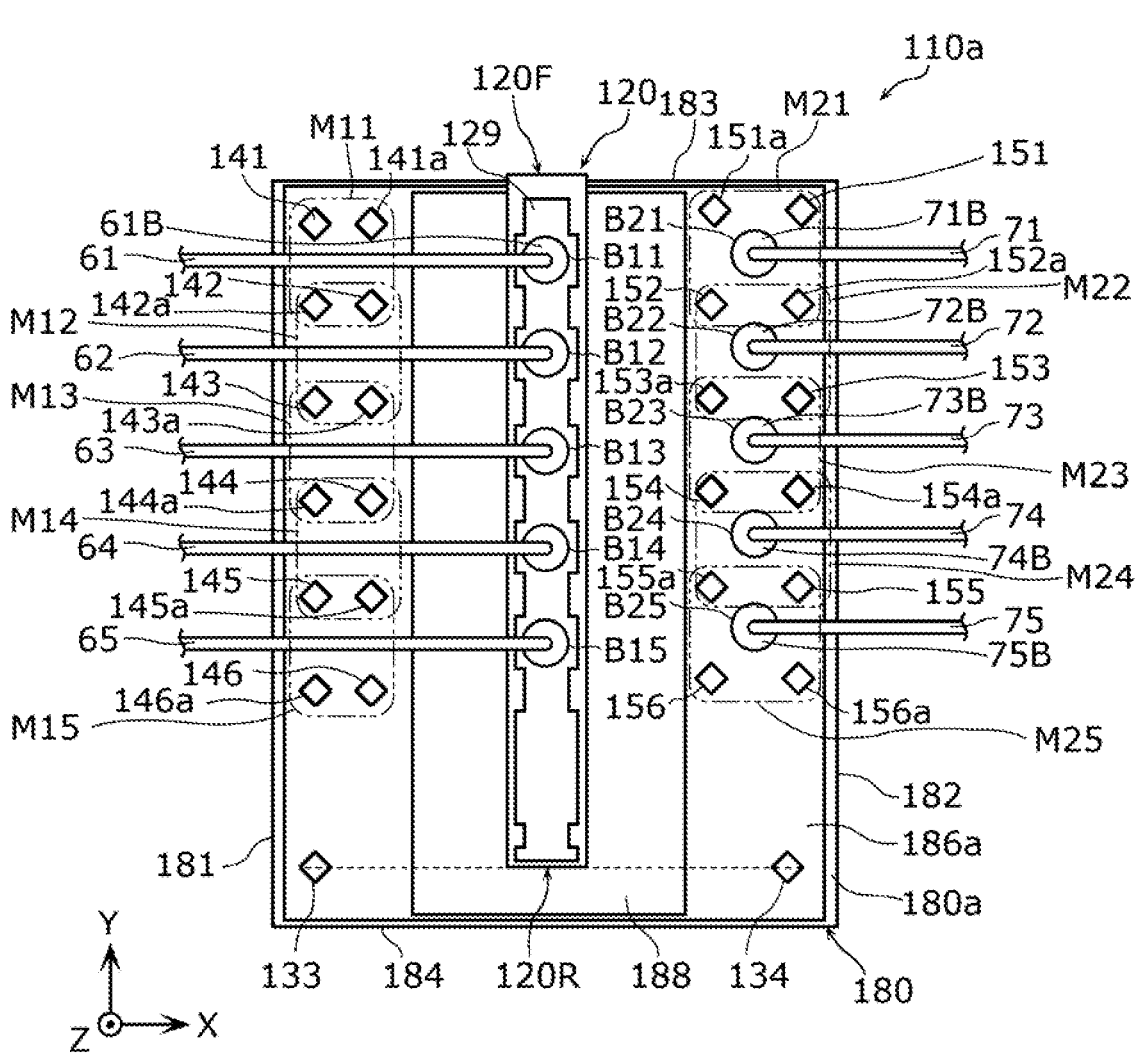
FIG. 32 is a schematic top view illustrating a plurality of first mark portions and a plurality of second mark portions of a semiconductor laser device according to a variation of Embodiment 2.

As an example in which there are three or more marks included in each mark portion, an example in which there are four marks included in each mark portion will be described with reference to FIG. 31 and FIG. 32. FIG. 31 is a schematic top view illustrating the plurality of second mark portions M20 through M29 of semiconductor laser device 310a according to a variation of Embodiment 3. FIG. 32 is a schematic top view illustrating the plurality of first mark portions M11 through M15 and the plurality of second mark portions M21 through M25 of semiconductor laser device 110a according to a variation of Embodiment 2.

Semiconductor laser device 310a according to a variation of Embodiment 3 illustrated in FIG. 31 differs from semiconductor laser device 310 according to Embodiment 3 in regard to the configuration of metal film 386a. In addition to second marks 350 through 361, second marks 350a to 359a are formed in metal film 386a.

Second marks 350a through 359a are disposed between semiconductor laser element 120 and second side 382 of main surface 380a. The shape and dimensions of second marks 350a through 359a according to the present variation are the same as for each first mark according to Embodiment 1. Second marks 350a through 359a have a quadrangular shape and are in contact with the outer edge of metal film 386a on the second side 382 side of main surface 380a. Stated differently, second marks 350a through 359a are notches formed inwardly from the second side 382 side end portion of metal film 386a.

Each of second mark portions M20 through 30 according to the present variation includes four second marks. Second mark portion M20 includes second marks 350 through 352 and 350a, second mark portion M21 includes second marks 351 through 353 and 351a, second mark portion M22 includes second marks 352 through 354 and 352a, second mark portion M23 includes second marks 353 through 355 and 353a, second mark portion M24 includes second marks 354 through 356 and 354a, second mark portion M25 includes second marks 355 through 357 and 355a, second mark portion M26 includes second marks 356 through 358 and 356a, second mark portion M27 includes second marks 357 through 359 and 357a, second mark portion M28 includes second marks 358 through 360 and 358a, and second mark portion M29 includes second marks 359 through 361 and 359a.

Each second mark portion may thus include four second marks. This allows second mark 350a to be used, for example, in positioning second wire 70 in the first direction and inspecting the position of second wire 70 in the first direction. Stated differently, the position of second wire 70 in the first direction can be determined so that second wire 70 overlaps second mark 350a in the top view of main surface 380a of substrate 380. When inspecting the position of second wire 70, whether or not second wire 70 overlaps second mark 350a in the top view of main surface 380a can be used to determine whether or not the position of second wire 70 in the first direction is acceptable. The other second wires 71 through 79 can similarly be positioned in the first direction and inspected for their positions using second marks 351a through 359a, respectively.

Semiconductor laser device 110a according to a variation of Embodiment 2 illustrated in FIG. 32 differs from semiconductor laser device 110 according to Embodiment 1 in regard to the configuration of metal film 186a. In addition to first marks 141 through 146 and second marks 151 through 156, first marks 141a through 146a, and second marks 151a through 156a are formed in metal film 186a.

First marks 141a through 146a are disposed between semiconductor laser element 120 and first side 181 of main surface 180a. The shape and dimensions of first marks 141a through 146a according to the present variation are the same as for first marks 141 through 146. First marks 141a through 146a are arranged in a staggered arrangement along the first direction. The positions of first marks 141a through 146a in the first direction are equal to the positions of first marks 141 through 146 in the first direction, respectively. First marks 141, 142a, 143, 144a, 145, and 146a are aligned in a single row in the first direction and spaced at equal intervals in the first direction. First marks 141a, 142, 143a, 144, 145a, and 146 are aligned in a single row in the first direction and spaced at equal intervals in the first direction. First marks 141, 142a, 143, 144a, 145, and 146a are disposed between first marks 141a, 142, 143a, 144, 145a, and 146 on one side and first side 181 on the other side.

Second marks 151a through 156a are disposed between semiconductor laser element 120 and second side 182 of main surface 180a. The shape and dimensions of second marks 151a through 156a according to the present variation are the same as for second marks 151 through 156. Second marks 151a through 156a are arranged in a staggered arrangement along the first direction. The positions of second marks 151a through 156a in the first direction are equal to the positions of second marks 151 through 156 in the first direction, respectively. Second marks 151, 152a, 153, 154a, 155, and 156a are aligned in a single row in the first direction and spaced at equal intervals in the first direction. Second marks 151a, 152, 153a, 154, 155a, and 156 are aligned in a single row in the first direction and spaced at equal intervals in the first direction. Second marks 151, 152a, 153, 154a, 155, and 156a are disposed between second marks 151a, 152, 153a, 154, 155a, and 156 on one side and second side 182 on the other side.

Each of first mark portions M11 through 15 according to the present variation includes four first marks. First mark portion M11 includes first marks 141, 141a, 142, and 142a, first mark portion M12 includes first marks 142, 142a, 143, and 143a, first mark portion M13 includes first marks 143, 143a, 144, and 144a, first mark portion M14 includes first marks 144, 144a, 145, and 145a, and first mark portion M15 includes first marks 145, 145a, 146, and 146a.

Each of second mark portions M21 through 25 according to the present variation includes four second marks. Second mark portion M21 includes second marks 151, 151a, 152, and 152a, second mark portion M22 includes second marks 152, 152a, 153, and 153a, second mark portion M23 includes second marks 153, 153a, 154, and 154a, second mark portion M24 includes second marks 154, 154a, 155, and 155a, and second mark portion M25 includes second marks 155, 155a, 156, and 156a.

Each mark portion may thus include four second marks.

In each of the above embodiments, the semiconductor laser element is exemplified as comprising a nitride semiconductor material, but the configuration of the semiconductor laser element is not limited to this example. The semiconductor laser element may comprise some other semiconductor material. For example, the semiconductor laser element may be a GaAs-based semiconductor laser element.

Various modifications of the above embodiments that may be conceived by those skilled in the art, as well as embodiments resulting from arbitrary combinations of elements and functions from different embodiments that do not depart from the essence of the present disclosure are included the present disclosure.

INDUSTRIAL APPLICABILITY

The semiconductor laser device according to the present disclosure is applicable in, for example, laser processing, as a high output power, highly efficient light source.

The invention claimed is:

1. A semiconductor laser device comprising:

a substrate including a main surface on which a metal film is formed;

a semiconductor laser element that is disposed on the main surface and includes a resonator extending along a first direction among in-plane directions of the main surface; and a plurality of first wire groups arranged along the first direction, wherein each of the plurality of first wire groups includes a first wire and a first mark portion, the first wire bonded to a first bonding region of a top surface of the semiconductor laser element, the first mark portion formed on the main surface, the main surface has a rectangular shape including a first side extending along the first direction, a second side disposed on an opposite side of the first side across the semiconductor laser element and extending along the first direction, and a third side perpendicular to the first side and the second side, and in a top view of the main surface:

the first wire of each of the plurality of first wire groups intersects the first side; and in each of the plurality of first wire groups, the first wire is disposed at a position overlapping the first mark portion.

2. The semiconductor laser device according to claim 1, further comprising:

a plurality of second wire groups arranged along the first direction, wherein each of the plurality of second wire groups includes a second wire and a second mark portion, the second wire bonded to a second bonding region of the main surface, the second mark portion formed on the main surface, the second bonding region is disposed between the semiconductor laser element and the second side, and in the top view of the main surface:

the second wire intersects the second side; and at least one of the second bonding region or the second wire is disposed at a position overlapping the second mark portion.

3. The semiconductor laser device according to claim 1, wherein in the top view of the main surface, the first mark portion includes a first mark disposed directly below the first wire.

4. The semiconductor laser device according to claim 1, wherein
in the top view of the main surface:
the first mark portion includes two first marks disposed spaced apart from each other and a line segment connecting the two first marks; and
the first wire overlaps the line segment connecting the two first marks.

5. The semiconductor laser device according to claim 1, wherein
the first mark portion includes a first mark formed in the metal film, and
the first mark is in contact with, among outer edges of the metal film, an outer edge closest to the first side.

6. The semiconductor laser device according to claim 1, further comprising:
a third mark and a fourth mark that are formed on the main surface, wherein
in the top view of the main surface, the third mark overlaps a straight line passing through and parallel to a front end face of the semiconductor laser element, and
in the top view of the main surface, the fourth mark overlaps a straight line passing through and parallel to a rear end face of the semiconductor laser element.

7. The semiconductor laser device according to claim 1, wherein
the semiconductor laser element includes an electrode disposed on the top surface,
the electrode includes a plurality of bonding portions and one or more intermediate portions, each of the one or more intermediate portions is disposed between two adjacent bonding portions among the plurality of bonding portions,
a width in a second direction perpendicular to the first direction of each of the plurality of bonding portions is greater than a width in the second direction of each of the one or more intermediate portions, and
among the plurality of bonding portions, a distance from a bonding portion closest to a front end face of the semiconductor laser element to the front end face is shorter than a distance from a bonding portion closest to a rear end face of the semiconductor laser element to the rear end face.

8. The semiconductor laser device according to claim 1, wherein
the first bonding regions corresponding to the plurality of first wire groups are arranged in a staggered arrangement along the first direction.

9. The semiconductor laser device according to claim 2, wherein
a total number of the plurality of second wire groups is greater than a total number of the plurality of first wire groups.

10. The semiconductor laser device according to claim 1, further comprising:
a bonding member that bonds the main surface and the semiconductor laser element, wherein
a distance from the bonding member to the first side is shorter than a distance from the bonding member to the second side.

11. The semiconductor laser device according to claim 1, wherein
a distance from the semiconductor laser element to the first side is shorter than a distance from the semiconductor laser element to the second side.

12. The semiconductor laser device according to claim 1, wherein
the plurality of first wire groups include three or more first wire groups,
the first wire of each of the three or more first wire groups intersects the first side, and
in each of the three or more first wire groups, the first wire is disposed at the position overlapping the first mark portion.

13. The semiconductor laser device according to claim 12, wherein
three or more first wires of the three or more first wire groups, each of which is the first wire, are arranged at equal intervals in the first direction.

14. The semiconductor laser device according to claim 2, wherein
the second wire of each of the plurality of second wire groups intersects the second side, and
in each of the plurality of second wire groups, at least one of second boding region or the second wire is disposed at the position overlapping the second mark portion.

15. The semiconductor laser device according to claim 2, wherein
the plurality of second wire groups include three or more second wire groups,
the second wire of each of the three or more second wire groups intersects the second side, and
in each of the three or more second wire groups, the second wire is disposed at the position overlapping the second mark portion.

16. The semiconductor laser device according to claim 15, wherein
three or more second wires of the three or more second wire groups, each of which is the second wire, are arranged at equal intervals in the first direction.

17. A semiconductor laser device comprising:
a substrate including a main surface on which a metal film is formed;
a semiconductor laser element that is disposed on the main surface and includes a resonator extending along a first direction among in-plane directions of the main surface; and
three or more second wire groups arranged along the first direction, wherein
each of the three or more second wire groups includes a second wire and a second mark portion, the second wire bonded to a second bonding region of the main surface, the second mark portion formed on the main surface,
the main surface has a rectangular shape including a first side extending along the first direction, a second side disposed on an opposite side of the first side across the semiconductor laser element and extending along the first direction, and a third side perpendicular to the first side and the second side,
the second bonding region is disposed between the semiconductor laser element and the second side, and
in a top view of the main surface:
the second wire of each of the three or more second wire groups intersects the second side; and
in each of the three or more second wire groups, at least one of the second bonding region or the second wire is disposed at a position overlapping the second mark portion.

18. The semiconductor laser device according to claim 17, wherein
in the top view of the main surface, the second mark portion includes a second mark disposed directly below the second wire.

19. The semiconductor laser device according to claim 17, wherein in the top view of the main surface:

the second mark portion includes two second marks disposed spaced apart from each other and a line segment connecting the two second marks; and the second wire overlaps the line segment connecting the two second marks.

20. The semiconductor laser device according to claim 17, wherein in the top view of the main surface:

the second mark portion includes two second marks disposed spaced apart from each other; and the second bonding region overlaps a line segment connecting the two second marks.

21. The semiconductor laser device according to claim 17, wherein the second mark portion includes a second mark formed in the metal film, and the second mark is in contact with, among outer edges of the metal film, an outer edge closest to the second side.

22. The semiconductor laser device according to claim 17 further comprising:

a third mark formed on the main surface; and a fourth mark formed on the main surface, wherein in the top view of the main surface, the third mark overlaps a straight line passing through and parallel to a front end face of the semiconductor laser element, in the top view of the main surface, the fourth mark overlaps a straight line passing through and parallel to a rear end face of the semiconductor laser element, and the second bonding region is disposed on a straight line connecting the third mark and the fourth mark.

23. The semiconductor laser device according to claim 17, wherein three or more second bonding regions corresponding to the three or more second wire groups are arranged in a staggered arrangement along the first direction.

24. The semiconductor laser device according to claim 17, wherein each of the three or more second wire groups includes one or more second marks, and the one or more second marks of the plurality of second wire groups are arranged in a staggered arrangement along the first direction.

25. The semiconductor laser device according to claim 17, further comprising:

a bonding member that bonds the main surface and the semiconductor laser element, wherein a distance from the second bonding region to the bonding member is shorter than a distance from the second bonding region to the second side.

26. The semiconductor laser device according to claim 17, wherein three or more second wires of the three or more second wire groups, each of which is the second wire, are arranged at equal intervals in the first direction.

27. A semiconductor laser device comprising:

a substrate including a main surface on which a metal film is formed;

a semiconductor laser element that is disposed on the main surface and includes a resonator extending along a first direction among in-plane directions of the main surface; and a plurality of second wire groups arranged along the first direction, wherein each of the plurality of second wire groups includes a second wire and a second mark portion, the second wire bonded to a second bonding region of the main surface, the second mark portion formed on the main surface, the main surface has a rectangular shape including a first side extending along the first direction, a second side disposed on an opposite side of the first side across the semiconductor laser element and extending along the first direction, and a third side perpendicular to the first side and the second side, the second bonding region is disposed between the semiconductor laser element and the second side, and in a top view of the main surface:

the second wire of each of the plurality of second wire groups intersects the second side; and in each of the plurality of second wire groups, at least one of the second bonding region or the second wire is disposed at a position overlapping the second mark portion in both the first direction and a direction perpendicular to the first direction.

\*  \*  \*  \*  \*